(12) United States Patent
Enomoto et al.

(10) Patent No.: US 7,736,985 B2
(45) Date of Patent: Jun. 15, 2010

(54) METHOD FOR MANUFACTURING SEMICONDUCTOR DEVICE USING OVERLAPPING EXPOSURE AND SEMICONDUCTOR DEVICE THEREOF

(75) Inventors: Hiroyuki Enomoto, Musashino (JP); Katsuya Hayano, Hachioji (JP); Shuntaro Machida, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 307 days.

(21) Appl. No.: 11/767,602

(22) Filed: Jun. 25, 2007

(65) Prior Publication Data

US 2008/0001239 A1 Jan. 3, 2008

(30) Foreign Application Priority Data

Jun. 29, 2006 (JP) .............................. 2006-178969

(51) Int. Cl.
*H01L 21/20* (2006.01)
*H01L 41/00* (2006.01)

(52) U.S. Cl. .............................. 438/393; 257/E21.035; 257/E21.351; 257/416

(58) Field of Classification Search ........................ None
See application file for complete search history.

(56) References Cited

U.S. PATENT DOCUMENTS

| 4,262,399 | A | * | 4/1981 | Cady ............................. 438/53 |
| 5,635,336 | A | * | 6/1997 | Bae .............................. 430/314 |
| 6,271,620 | B1 | | 8/2001 | Ladabaum |
| 6,320,239 | B1 | | 11/2001 | Eccardt et al. |
| 6,562,650 | B2 | | 5/2003 | Ladabaum |
| 6,571,445 | B2 | | 6/2003 | Ladabaum |
| 7,030,536 | B2 | * | 4/2006 | Smith et al. .................. 310/309 |

FOREIGN PATENT DOCUMENTS

| JP | 5-6849 A | 1/1993 |
| JP | 2004-071767 A | 3/2004 |

OTHER PUBLICATIONS

Knight et al., "Fabrication and Characterization of cMUTs for Forward Looking Intravascular Ultrasound Imaging", IEEE Ultrasonics Symposium, 2003, p. 577-580.

* cited by examiner

*Primary Examiner*—Thomas L Dickey
*Assistant Examiner*—Sergey Alekseyev
(74) *Attorney, Agent, or Firm*—Miles & Stockbridge P.C.

(57) ABSTRACT

The performance of a sensor in a semiconductor device can be improved. A plurality of oscillators forming an ultrasonic sensor are arranged on a main surface of a semiconductor chip. A negative-type photosensitive insulating film which protects the oscillators is deposited on an uppermost layer of the semiconductor chip. At the time of exposure for forming an opening in the photosensitive insulating film, the semiconductor chip is divided into a plurality of exposure areas and exposed, and then, the exposure areas are jointed so that the entire area is exposed. At this time, a stitching exposure area is arranged so that a center of the stitching exposure area in a width direction in the joint portion of the adjacent exposure areas is positioned at a center of a line which connects centers of oscillators located above and below the stitching exposure area.

15 Claims, 20 Drawing Sheets

METHOD FOR MANUFACTURING SEMICONDUCTOR DEVICE USING OVERLAPPING EXPOSURE AND SEMICONDUCTOR DEVICE THEREOF

CROSS-REFERENCE TO RELATED APPLICATION

The present application claims priority from Japanese Patent Application No. JP 2006-178969 filed on Jun. 29, 2006, the content of which is hereby incorporated by reference into this application.

TECHNICAL FIELD OF THE INVENTION

The present invention relates to a manufacturing method for a semiconductor device and a technology for a semiconductor device. In particular, it relates to a technology effectively applied to a manufacturing method for an ultrasonic sensor which is manufactured in accordance with the MEMS (micro electro mechanical system) technology.

BACKGROUND OF THE INVENTION

Ultrasonic sensors have been put to practical use in various kinds of apparatus including, for example, an ultrasonic-echo diagnostic apparatus for medical use and an ultrasonic flaw detector for nondestructive inspection.

As the ultrasonic sensors so far, those utilizing oscillation of a piezoelectric body have been mainly used. However, along with the recent progress of the MEMS technology, an ultrasonic sensor of capacitance-detection type using the MEMS technology has been developed.

In the ultrasonic sensor of capacitance-detection type, an oscillator having a cavity portion between mutually facing electrodes is formed on a semiconductor substrate, and when DC and AC voltages are applied and superimposed to the respective electrodes, a membrane oscillates in the vicinity of a resonant frequency, and ultrasonic waves are generated. By applying this principle and modifying the structure of the above-described electrodes, a 1.5 dimensional array of short-axis variable focus and a two dimensional array of real time 3D imaging have been researched and developed.

A technology concerning such an ultrasonic sensor is described in, for example, U.S. Pat. No. 6,320,239 B1 (Patent Document 1), in which a capacitance-detection type ultrasonic oscillator using a silicon substrate as a lower electrode is disclosed.

For example, U.S. Pat. No. 6,271,620 B1 (Patent Document 2) and "IEEE ULTRASONICS SYMPOSIUM, (USA), 2003, p 577-p 580" (Non-patent Document 1) disclose a capacitance-detection type ultrasonic oscillator which is formed on a patterned lower electrode.

For example, U.S. Pat. No. 6,571,445 B2 (Patent Document 3) and U.S. Pat. No. 6,562,650 B2 (Patent Document 4) disclose a technology for forming a capacitance-detection type ultrasonic oscillator on an upper layer of a signal processing circuit formed on a silicon substrate.

For example, Japanese Patent Application Laid-Open Publication No. 5-6849 (Patent Document 5) and Japanese Patent Application Laid-Open Publication No. 2004-071767 (Patent Document 6) disclose a technology that, when an area larger than an area which can be exposed by single exposure is divided into a plurality of exposure areas and they are exposed in a reduced projection exposure process, the overlapping exposure is performed for the joint portions of the divided exposure areas. These Patent Documents 5 and 6 disclose the means for suppressing a fluctuation (shift) in a width of a resist pattern in the overlapping exposure portions from a desired dimension. However, they do not disclose the control of the resist pattern in a thickness direction in the overlapping exposure portions. This is because the resist pattern is sufficient if it has a film thickness enough to withstand the dry etching process and it is eliminated thereafter by ashing or the like and does not remain on a semiconductor chip.

SUMMARY OF THE INVENTION

The ultrasonic sensor studied by the inventors of the present invention is an ultrasonic sensor of capacitance-detection type using the MEMS technology. A plurality of ultrasonic sensor cells (oscillators) are placed densely in a honeycomb form on a main surface of a semiconductor chip constituting the ultrasonic sensor.

Each ultrasonic sensor cell has a cell configuration of capacitance-detection type, in which a first electrode formed on the main surface of the semiconductor chip and a second electrode placed above the first electrode are faced to each other via a cavity portion.

Further, from a viewpoint of protecting a sensor surface of the semiconductor chip in a dicing process for cutting out the semiconductor chip from a semiconductor wafer, a photosensitive insulating film such as a negative-type photosensitive polyimide film is deposited on the main surface of the semiconductor chip constituting the ultrasonic sensor so as to cover the plurality of ultrasonic sensor cells.

Incidentally, when an opening for forming an electrode is formed in the negative-type photosensitive insulating film through an exposure process, since the whole area of the semiconductor chip is large, the semiconductor chip cannot be exposed entirely by single exposure. Therefore, as described in Patent Documents 5 and 6, the main surface of the semiconductor chip is divided into a plurality of exposure areas, and they are exposed and jointed so that the semiconductor chip is entirely exposed (hereinafter, referred to as stitching exposure).

However, the inventors of the present invention have found out that, when the stitching exposure is carried out for the ultrasonic sensor, the following problem arises.

That is, when the negative-type photosensitive insulating film is subjected to the stitching exposure, a protrusion is formed in stitching exposure areas in which double exposure is carried out for the joint portions between the exposure areas, and the thickness of the portions becomes thicker than the film thickness of other areas where the exposure areas are not superposed. Then, if the protrusion is formed at a position which is superposed on the cavity portions of the plurality of ultrasonic sensor cells as viewed in a plan view, the transmission attenuation amount of ultrasonic waves partly changes in the negative-type photosensitive insulating film. As a result, transmission/reception sensitivity of ultrasonic waves fluctuates, and the image irregularity occurs.

Therefore, an object of the present invention is to provide a technology which can improve the performance of a sensor of a semiconductor device.

The above and other objects and novel characteristics of the present invention will be apparent from the description of this specification and the accompanying drawings.

The typical ones of the inventions disclosed in this application will be briefly described as follows.

That is, the present invention includes: a step of forming a plurality of sensor cells having a cavity portion on a semiconductor substrate; and a step of depositing a negative-type photosensitive insulating film on the semiconductor substrate so as to cover the plurality of sensor cells, and the exposure process for the negative-type photosensitive insulating film has a step of exposing a plurality of exposure areas. In the joint portions of the plurality of exposure areas, a stitching exposure area where parts of the exposure areas are subjected to overlapping exposure is arranged. The stitching exposure area is arranged so that its center in a short-side direction is positioned at a center of a line which connects the centers of the adjacent sensor cells positioned above and below the stitching exposure area.

The effects obtained by typical aspects of the present invention will be briefly described below.

That is, the stitching exposure area is arranged so that its center in a short-side direction is positioned at a center of a line which connects the centers of the adjacent sensor cells positioned above and below the stitching exposure area. By this means, the performance of a sensor of a semiconductor device can be improved.

BRIEF DESCRIPTIONS OF THE DRAWINGS

DESCRIPTIONS OF THE PREFERRED EMBODIMENTS

In the embodiments described below, the invention will be described in a plurality of sections or embodiments. However, these sections or embodiments are not irrelevant to each other unless otherwise stated. Also, components having the same function are denoted by the same reference symbols throughout the drawings for describing the embodiment, and the repetitive description thereof will be omitted. Hereinafter, embodiments of the present invention will be described in detail with reference to the accompanying drawings.

First Embodiment

A semiconductor device according to the first embodiment is an ultrasonic transmitting/receiving sensor which is manufactured by using, for example, a MEMS (micro electro mechanical system) technology.

Figure 1:
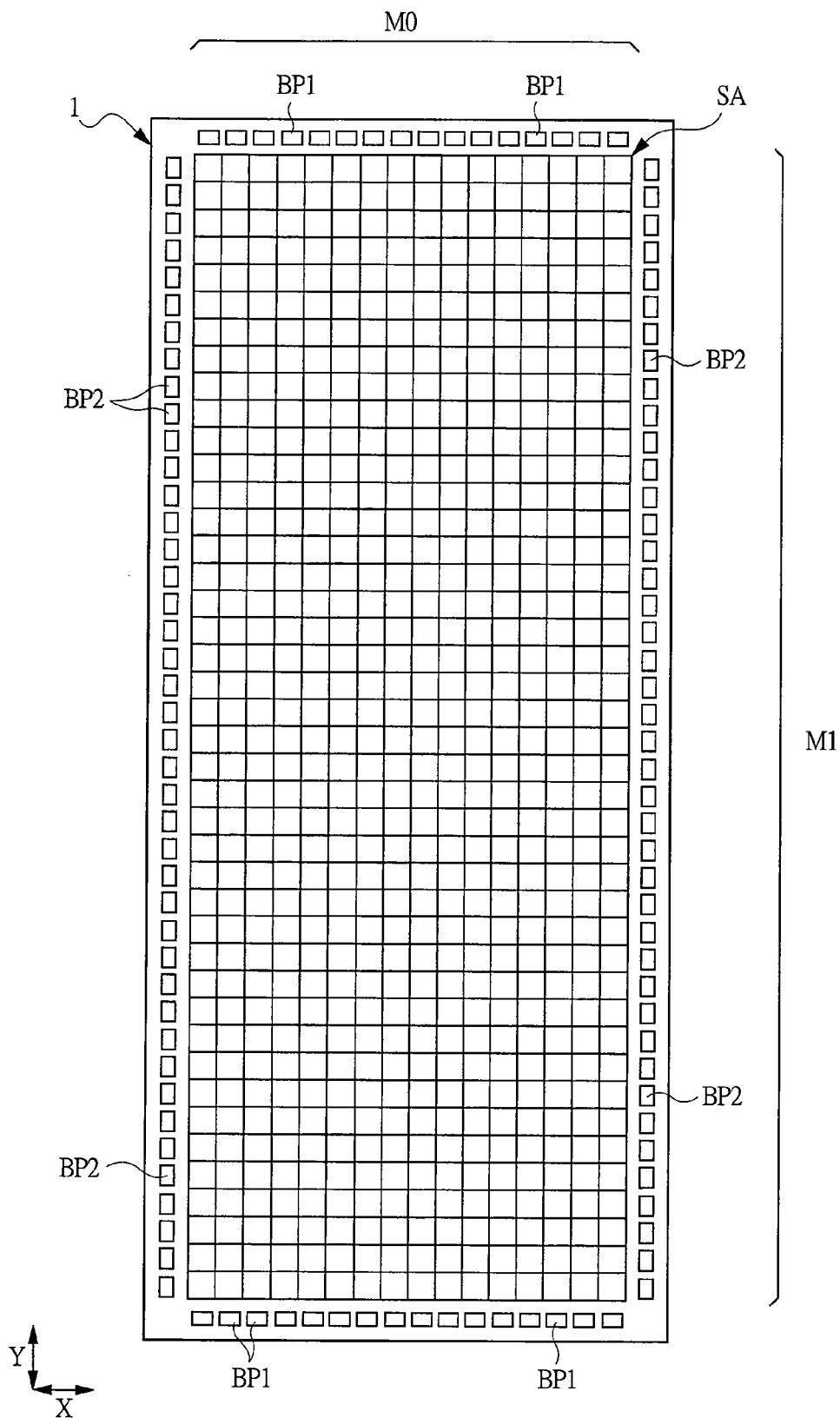
FIG. 1 is an entire plan view illustrating a semiconductor chip constituting a semiconductor device according to an embodiment of the present invention.

FIG. 1 is a plan view showing the entirety of a semiconductor chip 1 which constitutes the semiconductor device according to the first embodiment. The semiconductor chip 1 has a first main surface and a second main surface which are located on the opposite sides in the thickness direction. For example, the semiconductor chip 1 is formed to have a rectangular planar shape. The length of the semiconductor chip 1 in the longitudinal direction (second direction Y) is, for example, about 4 cm and the length of the semiconductor chip 1 in the short-side direction (first direction X) is, for example, about 1 cm.

However, the planar dimensions of the semiconductor chip 1 are not limited to these, and a variety of modifications are possible. There are sensors in various sizes, for example, one having a length in the longitudinal direction (second direction Y) of about 8 cm and a length in the short-side direction (first direction X) of about 1.5 cm.

A sensor cell array SA and a plurality of bonding pads (hereinafter, referred to as pads) BP1 and BP2 are arranged on the first main surface of the semiconductor chip 1.

A plurality of lower electrode wirings (first wirings) M0, a plurality of upper electrode wirings (second wirings) M1 which cross the lower electrode wirings M0 at a right angle, and a plurality of oscillators (sensor cells) are arranged in the sensor cell array SA.

The lower electrode wirings M0 are formed so as to extend in the longitudinal direction (second direction Y) of the semiconductor chip 1, and for example, 16 channels (hereinafter, also referred to as "ch") of the lower electrode wirings M0 are aligned in the short-side direction (first direction X) of the semiconductor chip 1.

The lower electrode wirings M0 are electrically connected to the pads BP1. The pads BP1 are arranged in the outer periphery of the sensor cell array SA and in the vicinity of both ends in the longitudinal direction (second direction Y) of the semiconductor chip 1 so as to be aligned along the short sides of the semiconductor chip 1 and correspond to the lower electrode wirings M0.

The upper electrode wirings M1 are formed so as to extend in the short-side direction (first direction X) of the semiconductor chip 1, and for example, 192 ch of the upper electrode wirings M1 are aligned in the longitudinal direction (second direction Y) of the semiconductor chip 1.

The upper electrode wirings M1 are electrically connected to the pads BP2. The pads BP2 are arranged in the outer periphery of the sensor cell array SA and in the vicinity of both ends in the short-side direction (first direction X) of the semiconductor chip 1 so as to be aligned along the longitudinal sides of the semiconductor chip 1 and correspond to the upper electrode wirings M1.

The oscillators have an electrostatic variable capacitance configuration and are arranged at the intersections of the lower electrode wirings M0 and the upper electrode wirings M1. More specifically, the oscillators are arranged in the sensor cell array SA so as to be regularly aligned in a matrix form. In the sensor cell array SA, for example, fifty oscillators are arranged in parallel at the intersections of the lower electrode wirings M0 and the upper electrode wirings M1.

Figure 2:
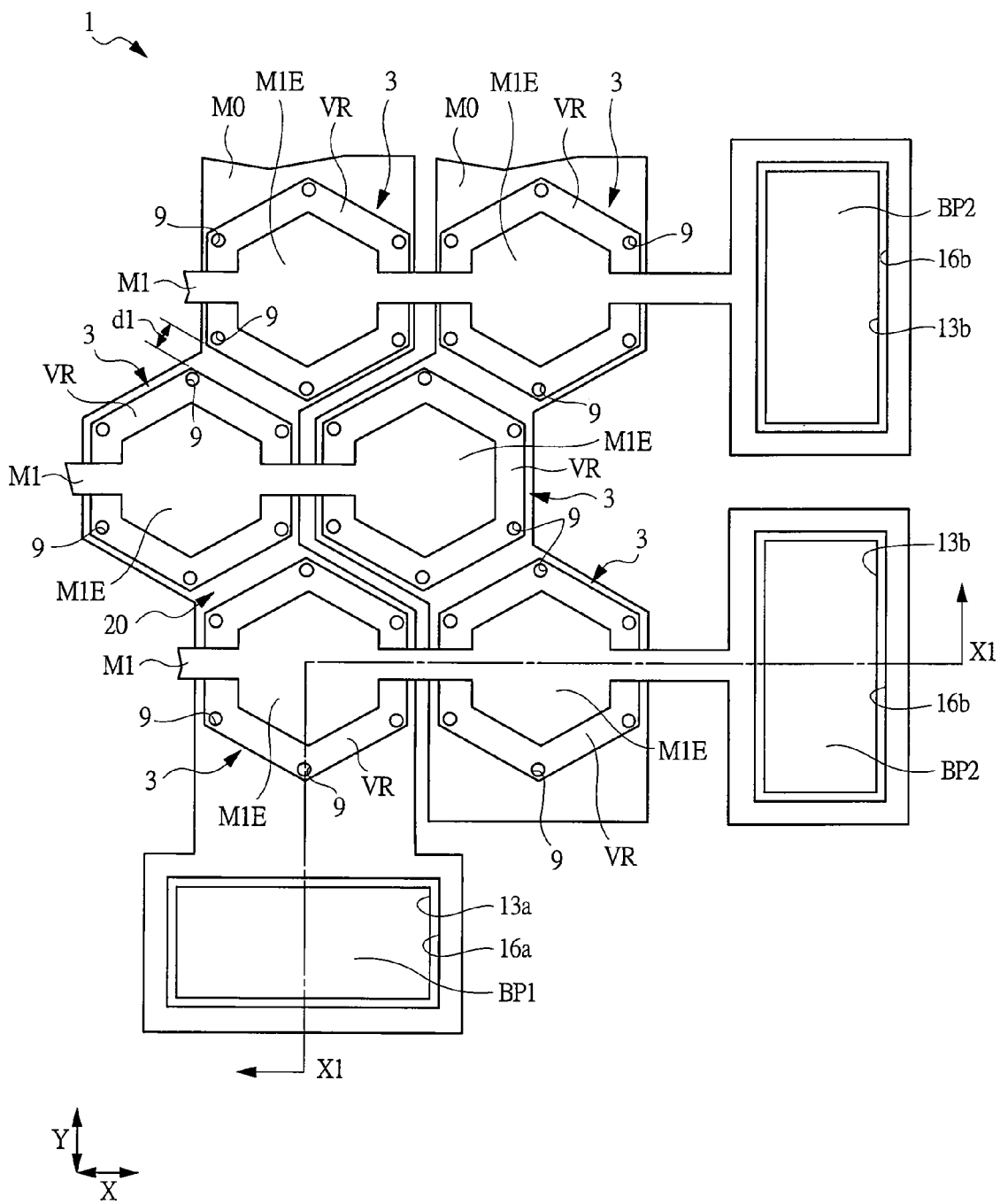
FIG. 2 is an enlarged plan view illustrating a principal part of the semiconductor chip of FIG. 1.
Figure 3:
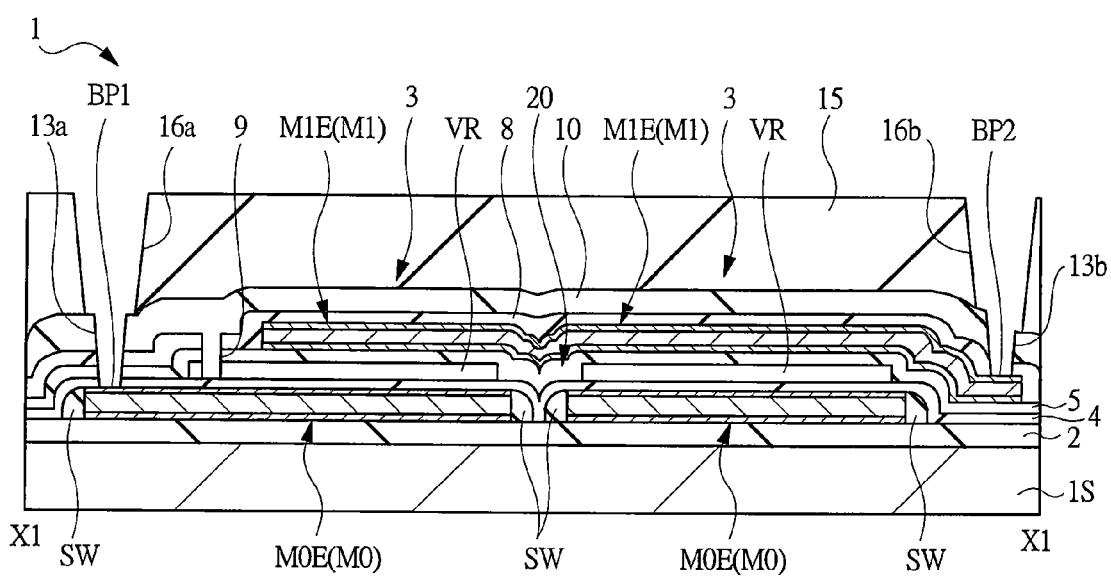
FIG. 3 is a sectional view taken along the line X1-X1 of FIG. 2.

Next, FIG. 2 is an enlarged plan view showing the principal part of the semiconductor chip 1, and FIG. 3 is a sectional view taken along the line X1-X1 of FIG. 2. Here, FIG. 2 is a plan view showing a case where one oscillator is arranged at the intersection of the lower electrode wiring M0 and the upper electrode wiring M1.

A semiconductor substrate 1S which constitutes the semiconductor chip 1 is made of, for example, single crystal silicon (Si) and has a first main surface and a second main surface which are located on the opposite sides in the thickness direction. The plurality of oscillators 3 are arranged on the first main surface of the semiconductor substrate 1S with interposing an insulating film 2 made of, for example, silicon oxide ($SiO_2$) or the like therebetween.

The plurality of oscillators 3, each of which is formed, for example, in a hexagonal form, are arranged in a honeycomb form. Therefore, the plurality of oscillators 3 can be highly densely arranged, and thus, the sensor performance can be improved.

Further, each oscillator 3 has a lower electrode (first electrode) M0E, an upper electrode (second electrode) M1E provided so as to face the lower electrode M0E, and a cavity portion VR interposed between these electrodes.

The lower electrode M0E is formed in a part of the lower electrode wiring M0 on which the upper electrode wiring M1 is superimposed. The lower electrodes M0E and the lower electrode wirings M0 are formed by depositing, for example, a titanium nitride (TiN) film, an aluminum (Al) film, and a titanium nitride film in this order from below. A tungsten (W) film may be used instead of the titanium nitride film.

Sidewalls SW made of silicon oxide are formed on the side surfaces of the lower electrodes M0E and the lower electrode wirings M0 in order to reduce the height difference due to the thickness of the lower electrodes M0E and lower electrode wirings M0. The surfaces of the lower electrodes M0E, the lower electrode wirings M0, and the insulating film 2 are coated with an insulating film 4 made of, for example, silicon oxide.

An insulating film 5 made of, for example, a silicon oxide film is deposited on this insulating film 4. The upper electrodes M1E are provided on the insulating film 5 so as to face the lower electrodes M0E. The upper electrodes M1E are formed in a part of the upper electrode wirings M1 where the lower electrode wirings M0 are superimposed therebelow. The upper electrode M1E is formed to have a hexagonal planar form and is formed of a pattern wider than the upper electrode wiring M1. The upper electrodes M1E and the upper electrode wirings M1 are formed by depositing, for example, a titanium nitride film, an aluminum film, and a titanium nitride film in this order from below. A tungsten film may be used instead of the titanium nitride film.

The cavity portions VR are formed between the lower electrodes M0E and the upper electrodes M1E (between the insulating films 4 and 5). The cavity portions VR are formed to have a hexagonal planar form. Further, the planar dimensions of the cavity portion VR are larger than the planar dimensions of the upper electrodes M1E.

An insulating film 8 made of, for example, a silicon nitride ($Si_3N_4$) film is deposited on the insulating film 5 so as to cover the upper electrodes M1E and the upper electrode wirings M1. Holes 9 which reach the cavity portion VR are formed in the vicinity of the hexagonal corners of the cavity portion VR. The holes 9 are used to form the cavity portion VR as described below.

An insulating film 10 made of, for example, a silicon nitride film is deposited on the insulating film 8. A part of the insulating film 10 enters in the holes 9, and thus, the holes 9 are closed.

An opening 13a which reaches a part of the lower electrode wiring M0 is formed in the insulating films 4, 5, 8, and 10. The part of the lower electrode wiring M0 which is exposed through the opening 13a becomes the pad BP1. In addition, an opening 13b which reaches a part of the upper electrode wiring M1 is formed in the insulating films 8 and 10. The part of the upper electrode wiring M1 which is exposed through the opening 13b becomes the pad BP2.

A negative-type photosensitive insulating film 15 is deposited on the insulating film 10. The negative-type photosensitive insulating film 15 is made of a negative-type organic photosensitive insulating film such as a negative-type photosensitive polyimide film.

An opening 16a which reaches a part of the lower electrode wiring M0 is formed in the photosensitive insulating film 15. A position and planar dimensions of the opening 16a are determined so that the opening 16a can include the opening 13a. A part of the lower electrode wiring M0 exposed through the opening 16a becomes the pad BP1.

Further, an opening 16b which reaches a part of the upper electrode wiring M1 is formed in the photosensitive insulating film 15. A position and planar dimensions of the opening 16b are determined so that the opening 16b can include the opening 13b. A part of the upper electrode wiring M1 exposed through the opening 16b becomes the pad BP2. Bonding wires are electrically connected to the pads BP1 and BP2.

The photosensitive insulating film 15 as described above has a function as a protective film for protecting the plurality of oscillators 3 on the first main surface of the semiconductor chip 1 in a dicing process or the like for cutting out the semiconductor chip 1 from a semiconductor wafer.

It is, therefore, desirable that the photosensitive insulating film 15 is a thick film from a viewpoint of the protecting function. The reason why a negative-type film is used as the photosensitive insulating film 15 is that its thickness can be increased more easily than the positive-type film without putting a load on the exposure. More specifically, in the case of a positive-type film, since the entire area to be removed by the development (hereinafter, referred to as development area) in the thickness direction has to be exposed, the exposure is difficult when the film thickness is increased. On the other hand, in the case of the negative-type film, since the resistance to a developer can be obtained by exposing a surface portion to be left as a pattern, the exposure is not difficult even when the film thickness is increased.

Further, the reason why a photosensitive film is used is that microfabrication is taken into consideration. More specifically, although it is also possible to employ the method in which a non-photosensitive polyimide film is used as a protective film and a pattern is formed by a lithography method and an etching method using the resist film, wet etching using an alkaline developer has to be used for the etching, and the dimensional accuracy is deteriorated several times lower than that of the photosensitive polyimide film. Further, although it is desirable that the protective film has a larger thickness as described above, the amount of the alkaline developer and the etching time are increased as the non-photosensitive polyimide film becomes thicker. For this reason, the dimensional accuracy is further deteriorated, and thus the non-photosensitive polyimide film is disadvantageous for practical use.

A pillar-shaped body 20 is arranged between the plurality of adjacent oscillators 3 (adjacent cavity portions VR) so as to separate the adjacent oscillators 3 (adjacent cavity portions VR). A width of the pillar-shaped body 20 (dimension in a short-side direction, concretely, gap between the adjacent cavity portions VR) d1 is, for example, about 2 µm. The pillar-shaped body 20 is formed to have, for example, a planar hexagonal lattice shape (frame shape) when viewed in a plan view. Also, the pillar-shaped body 20 is formed by laminating a sidewall SW and parts of the insulating films 4 and 5 when viewed in a sectional view. More specifically, the pillar-shaped body 20 is jointed and fixed to the semiconductor substrate 1S.

In such an ultrasonic transmitting/receiving sensor, when DC and AC voltages are applied and superimposed to the lower electrode wirings M0 (lower electrodes M0E) and the upper electrode wirings M1 (upper electrodes M1E), a membrane (on a forming surface of the cavity portion VR is formed) oscillates in a direction which crosses a first main surface of the semiconductor substrate 1 in the vicinity of a resonant frequency, and ultrasonic pulses of several MHz are generated. Further, a displacement in the gap between the lower electrodes M0E and the upper electrodes M1E due to a reflected wave is detected as a change in electrostatic capacitance.

Next, an example of the method for manufacturing a semiconductor device according to a first embodiment will be described below with reference to FIG. 4 to FIG. 14. FIG. 4 to FIG. 14 are sectional views taken along the line X1-X1 of FIG. 2 illustrating the semiconductor substrate 1S during the semiconductor device manufacturing process in the first embodiment.

Figure 4:
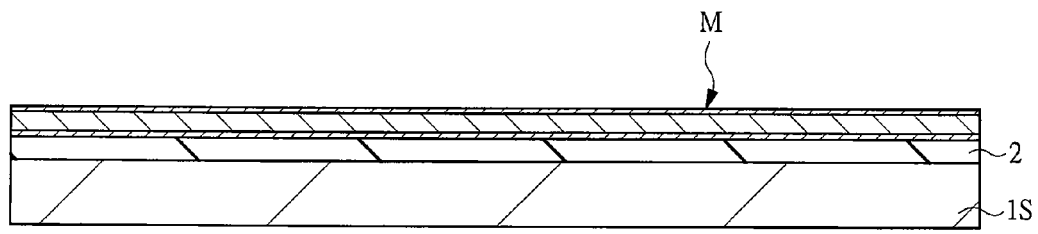
FIG. 4 is a sectional view illustrating a semiconductor substrate at a portion corresponding to the line X1-X1 of FIG. 2 in the manufacturing process of a semiconductor device according to an embodiment of the present invention.

First, as shown in FIG. 4, the semiconductor substrate (at this stage, a semiconductor thin plate having an approximately circular planar shape and referred to as a semiconductor wafer) 1S is prepared. The semiconductor substrate 1S is made of, for example, single crystal silicon and has a first main surface and a second main surface which are located on the opposite sides in the thickness direction.

Subsequently, an insulating film 2 made of, for example, a silicon oxide ($SiO_2$) film is deposited on the entire first main surface of the semiconductor substrate 1S so as to have a thickness of about 400 nm. Thereafter, a conductor film M for forming the lower electrode wirings (lower electrodes) is deposited thereon. The conductor film M is formed by laminating, for example, a titanium nitride film, an aluminum film and a titanium nitride film in this order flow below. A total thickness of the conductor film M is about 750 nm. A tungsten film may be used instead of the titanium nitride film.

Figure 5:
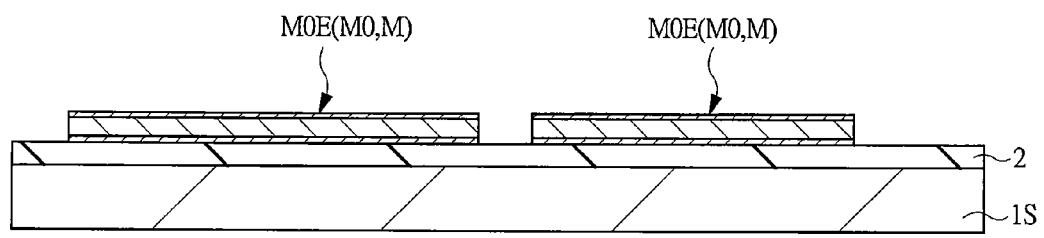
FIG. 5 is a sectional view illustrating the semiconductor substrate at the portion corresponding to the line X1-X1 of FIG. 2 in the manufacturing process of a semiconductor device subsequent to FIG. 4.

Thereafter, the conductor film M is patterned by a lithography method and a dry etching method. By doing so, the lower electrode wirings M0 (lower electrodes M0E) are formed in a plurality of chip forming areas on the first main surface of the semiconductor substrate is as shown in FIG. 5. A distance between the adjacent lower electrode wirings M0 is, for example, about 2 µm.

The lithography method is the method for patterning a resist film into a desired pattern (resist pattern) through a series of steps of applying a resist film and exposing and developing the film.

Figure 6:
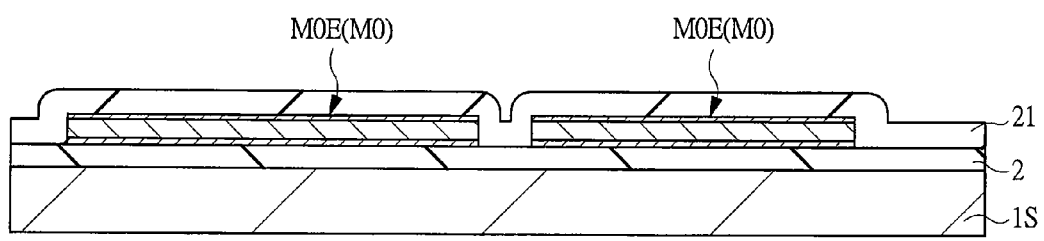
FIG. 6 is a sectional view illustrating the semiconductor substrate at the portion corresponding to the line X1-X1 of FIG. 2 in the manufacturing process of a semiconductor device subsequent to FIG. 5.

Next, as shown in FIG. 6, an insulating film 21 made of, for example, a silicon oxide film is deposited on the entire first main surface of the semiconductor substrate is (semiconductor wafer) by a plasma CVD (Chemical Vapor Deposition) method so as to cover the surfaces of the lower electrode wirings M0. The thickness of the insulating film 21 is equal to or less than the half of the distance between the adjacent lower electrode wirings M0 and is, for example, about 600 nm.

Figure 7:
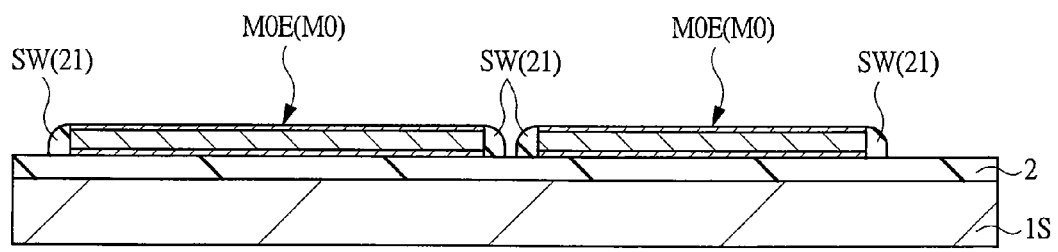
FIG. 7 is a sectional view illustrating the semiconductor substrate at the portion corresponding to the line X1-X1 of FIG. 2 in the manufacturing process of a semiconductor device subsequent to FIG. 6.

Subsequently, the insulating film 21 is etched back by an anisotropic dry etching method until the upper surfaces of the lower electrode wirings M0 (upper surfaces of the uppermost titanium nitride films) are exposed. By this means, as shown in FIG. 7, sidewalls SW are formed on side surfaces of the lower electrode wirings M0 (lower electrodes M0E).

Figure 8:
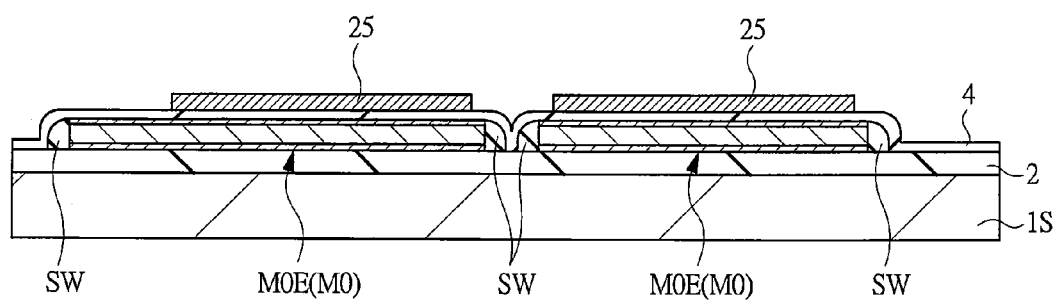
FIG. 8 is a sectional view illustrating the semiconductor substrate at the portion corresponding to the line X1-X1 of FIG. 2 in the manufacturing process of a semiconductor device subsequent to FIG. 7.

Next, as shown in FIG. 8, an insulating film 4 made of a silicon oxide film is deposited on the entire first main surface of the semiconductor substrate 1S by the CVD method so as to cover the surfaces of the lower electrode wirings M0 (lower electrodes M0E) and the surfaces of the sidewalls SW. The thickness of the insulating film 4 is, for example, about 200 nm.

Subsequently, a sacrificial film made of, for example, a polycrystalline silicon film is deposited on the entire surface of the insulating film 4 on the first main surface of the semiconductor substrate 1S by the CVD method so as to have a thickness of about 100 nm. Thereafter, the sacrificial film is patterned by the lithography method and the dry etching method, thereby forming sacrificial patterns 25. The sacrificial patterns 25 are patterns for forming the cavity portions VR, and the planar shape of the sacrificial patterns 25 is the same as that of the cavity portions VR.

Figure 9:
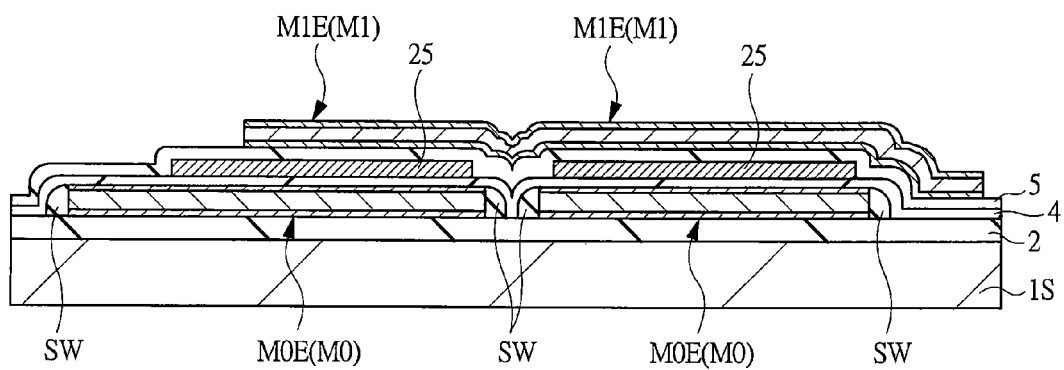
FIG. 9 is a sectional view illustrating the semiconductor substrate at the portion corresponding to the line X1-X1 of FIG. 2 in the manufacturing process of a semiconductor device subsequent to FIG. 8.

Next, as shown in FIG. 9, an insulating film 5 made of, for example, a silicon oxide film having a thickness of about 200 nm is deposited on the entire first main surface of the semiconductor substrate 1S (semiconductor wafer) by the CVD method so as to cover the surfaces of the sacrificial patterns 25.

Subsequently, after a conductor film for forming the upper electrode wirings (upper electrodes) is deposited on the insulating film 5, the conductor film is patterned in the same manner as the lower electrode wirings M0, thereby forming the upper electrode wirings M1 and the upper electrodes M1E.

The conductor film for forming the upper electrode wirings has the same structure as that of the conductor film M for forming the lower electrode wirings M0. The total thickness of the conductor film for forming the upper electrode wirings is, for example, about 400 nm which is smaller than the total thickness of the conductor film M for forming the lower electrode wirings.

Figure 10:
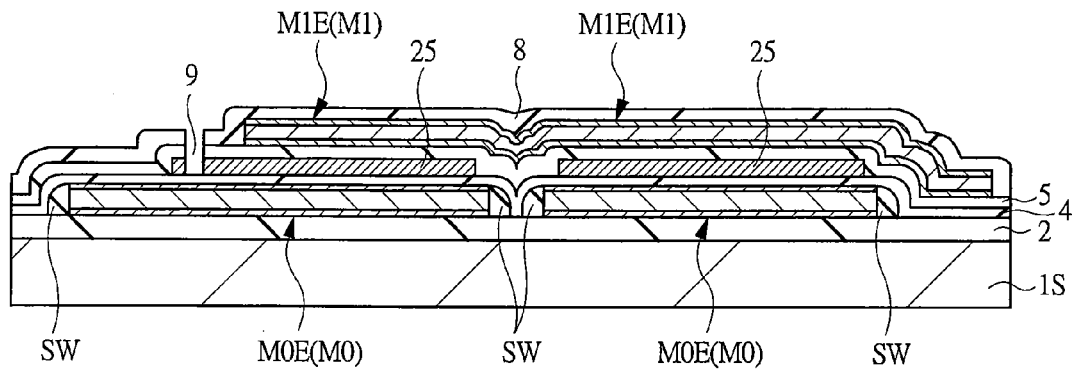
FIG. 10 is a sectional view illustrating the semiconductor substrate at the portion corresponding to the line X1-X1 of FIG. 2 in the manufacturing process of a semiconductor device subsequent to FIG. 9.

Thereafter, as shown in FIG. 10, after an insulating film 8 made of, for example, a silicon nitride ($Si_3N_4$) film is deposited on the entire first main surface of the semiconductor substrate 1S by the CVD method so as to have a thickness of about 500 nm, holes 9 which reach the sacrificial patterns 25 are formed in the insulating films 8 and 5 by the lithography method and the dry etching method.

Figure 11:
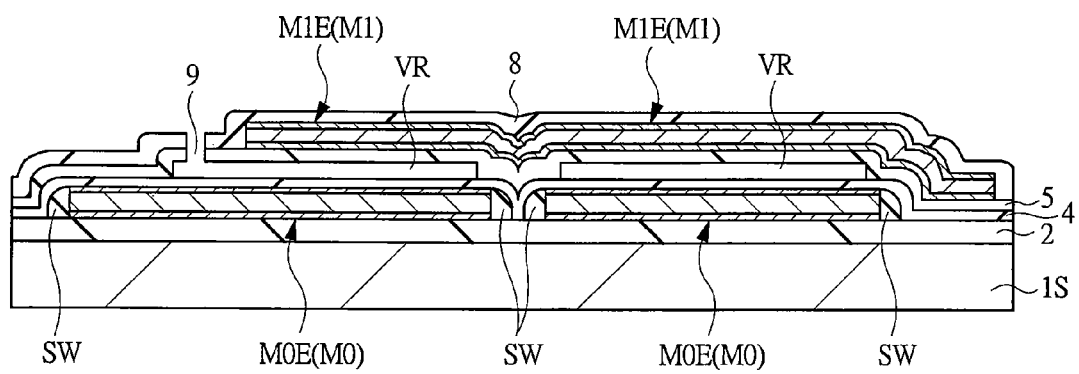
FIG. 11 is a sectional view illustrating the semiconductor substrate at the portion corresponding to the line X1-X1 of FIG. 2 in the manufacturing process of a semiconductor device subsequent to FIG. 10.

Next, the sacrificial patterns 25 are selectively wet-etched through the holes 9 by using, for example, a potassium hydroxide solution. By this means, as shown in FIG. 11, the cavity portions VR are formed in gaps (removed area of the sacrificial patterns 25) between the lower electrode wirings M0 (lower electrodes M0E) and upper electrode wirings M1 (upper electrodes M1E) faced to each other.

Further, portions of the lower electrode wirings M0 faced to the upper electrode wirings M1 via the cavity portions VR correspond to the lower electrodes M0E, and portions of the upper electrode wirings M1 faced to the lower electrode wirings M0 via the cavity portions VR correspond to the upper electrodes M1E.

Figure 12:
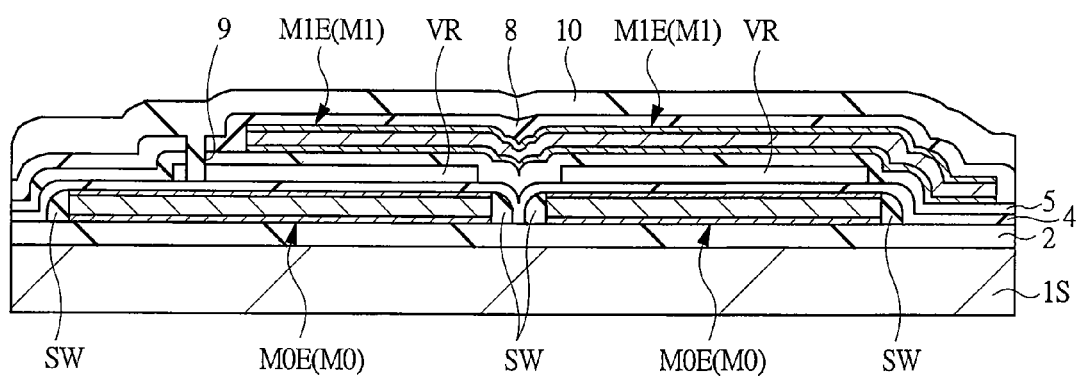
FIG. 12 is a sectional view illustrating the semiconductor substrate at the portion corresponding to the line X1-X1 of FIG. 2 in the manufacturing process of a semiconductor device subsequent to FIG. 11.

Subsequently, as shown in FIG. 12, an insulating film 10 made of, for example, a silicon nitride film is deposited on the entire first main surface of the semiconductor substrate 1S by the plasma CVD method so as to have a thickness of about 800 nm. By this means, a part of the insulating film 10 is embedded into the holes 9 so as to close the holes 9.

Figure 13:
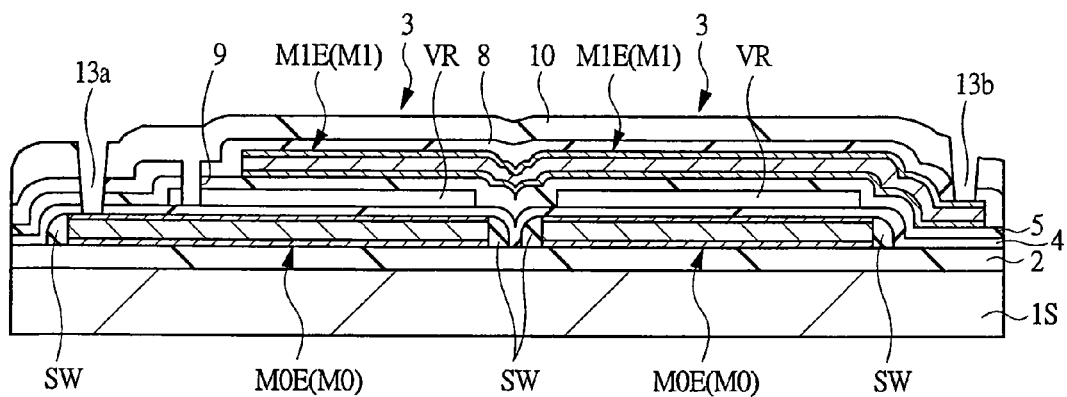
FIG. 13 is a sectional view illustrating the semiconductor substrate at the portion corresponding to the line X1-X1 of FIG. 2 in the manufacturing process of a semiconductor device subsequent to FIG. 12.

Thereafter, as shown in FIG. 13, an opening 13a through which a part of the lower electrode wiring M0 is exposed is formed in the insulating films 10, 8, 5, and 4, and an opening 13b through which a part of the upper electrode wiring M1 is exposed is formed in the insulating films 10 and 8 by the lithography method and the dry etching method. By this means, the oscillators 3 having an electrostatic variable capacitance configuration are formed.

Figure 14:
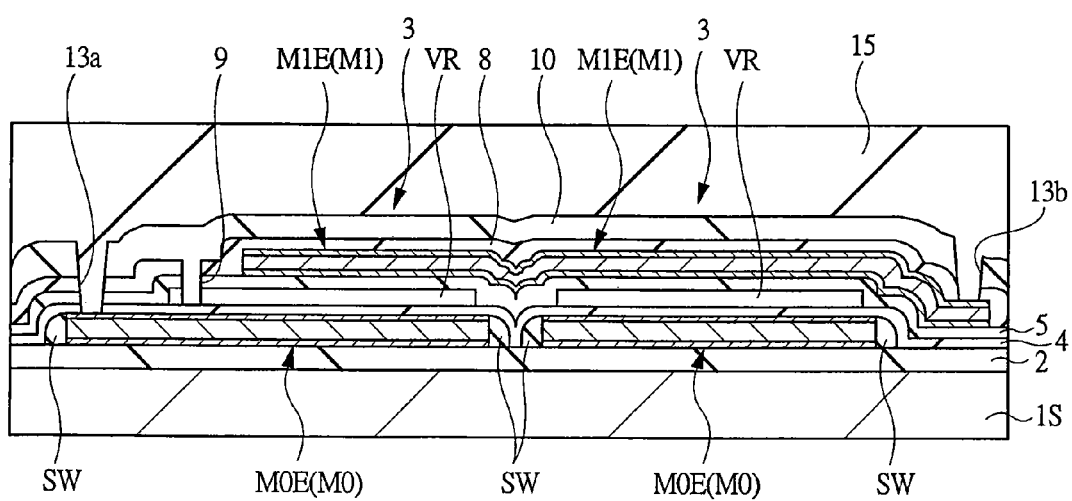
FIG. 14 is a sectional view illustrating the semiconductor substrate at the portion corresponding to the line X1-X1 of FIG. 2 in the manufacturing process of a semiconductor device subsequent to FIG. 13.

Next, as shown in FIG. 14, a photosensitive insulating film 15 such as a negative-type photosensitive polyimide film is applied to the entire first main surface of the semiconductor substrate 1S (semiconductor wafer) by a spin-coating method so as to have a thickness of about 9 µm.

Subsequently, the negative-type photosensitive insulating film 15 is subjected to the exposure and development processes. By doing so, openings 16a and 16b through which the lower electrode wirings M0 and the upper electrode wirings M1 are partially exposed are formed in the photosensitive insulating film 15 as shown in FIG. 2 and FIG. 3. In this exposure, a bright field pattern type reticle to be mentioned later is used. An i beam with a wavelength of 365 nm is used as exposing light. A thickness of the photosensitive insulating film 15 after the development process is, for example, about 3.5 µm. The positions and planar dimensions of the openings 16a and 16b are determined so that the openings 16a and 16b can include the openings 13a and 13b, respectively. Parts of the lower electrode wirings M0 and the upper electrode wirings M1 which are exposed through the openings 16a and 16b are used as the pads BP1 and BP2, respectively.

Thereafter, respective chip areas are cut out from the semiconductor substrate 1S (semiconductor wafer) by the dicing process. In this manner, the semiconductor chip 1 is manufactured.

The exposure process for the negative-type photosensitive insulating film 15 will be described below.

The exposure area which can be exposed by one-time exposure of an optical reduced projection exposure apparatus used in the exposure process for the negative-type photosensitive insulating film 15 is normally about 20 to 30 mm. For this reason, the semiconductor chip 1 having a large planer dimension cannot be entirely exposed by one-time exposure. In this case, therefore, it is necessary that one chip area is divided into a plurality of exposure areas, exposure is carried out repeatedly to each exposure area, and patterns are jointed on the joint portions of the divided exposure areas.

Figure 15:
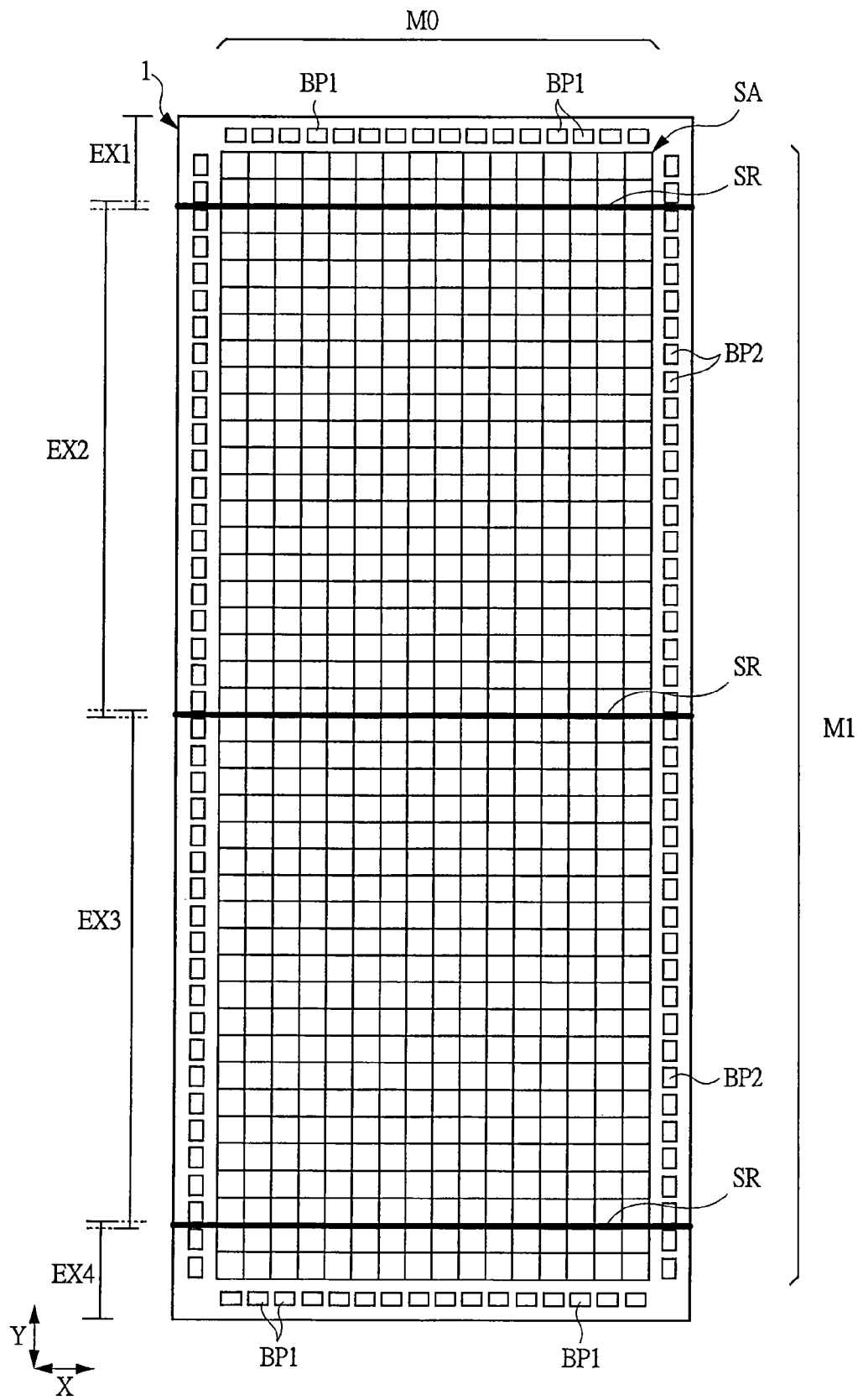
FIG. 15 is a plan view illustrating an example of a state of a plurality of exposure areas in a semiconductor chip area at the time of an exposure process in the manufacturing process of a semiconductor device according to an embodiment of the present invention.

FIG. 15 illustrates an example of a state of the plurality of exposure areas EX1 to EX4 on the semiconductor chip 1 (at this stage, chip area on the semiconductor wafer) at the time of the exposure process.

In the first embodiment, the length of the semiconductor chip 1 in a longitudinal direction (second direction Y) is 4 cm, and the length in a short-side direction (first direction X) is 1 cm. Therefore, in this exposure method, the exposure is repeated four times in the longitudinal direction of the semiconductor chip 1, and the semiconductor chip 1 has three stitching exposure areas SR.

The exposure area EX1 is a first-time exposure area, the exposure area EX2 is a second-time exposure area, the exposure area EX3 is a third-time exposure area, and the exposure area EX4 is a fourth-time exposure area. The same type of reticles (masks) are used for the second-time and third-time exposure areas EX2 and EX3.

In the joint portions of the adjacent exposure areas (EX1 and EX2, EX2 and EX3, EX3 and EX4) in the divided exposure areas EX1 to EX4, the adjacent exposure areas (EX1 and EX2, EX2 and EX3, EX3 and EX4) are partially superposed, and thus double exposure is carried out there. The areas where the double exposure is carried out are the stitching exposure areas SR.

Figure 16:
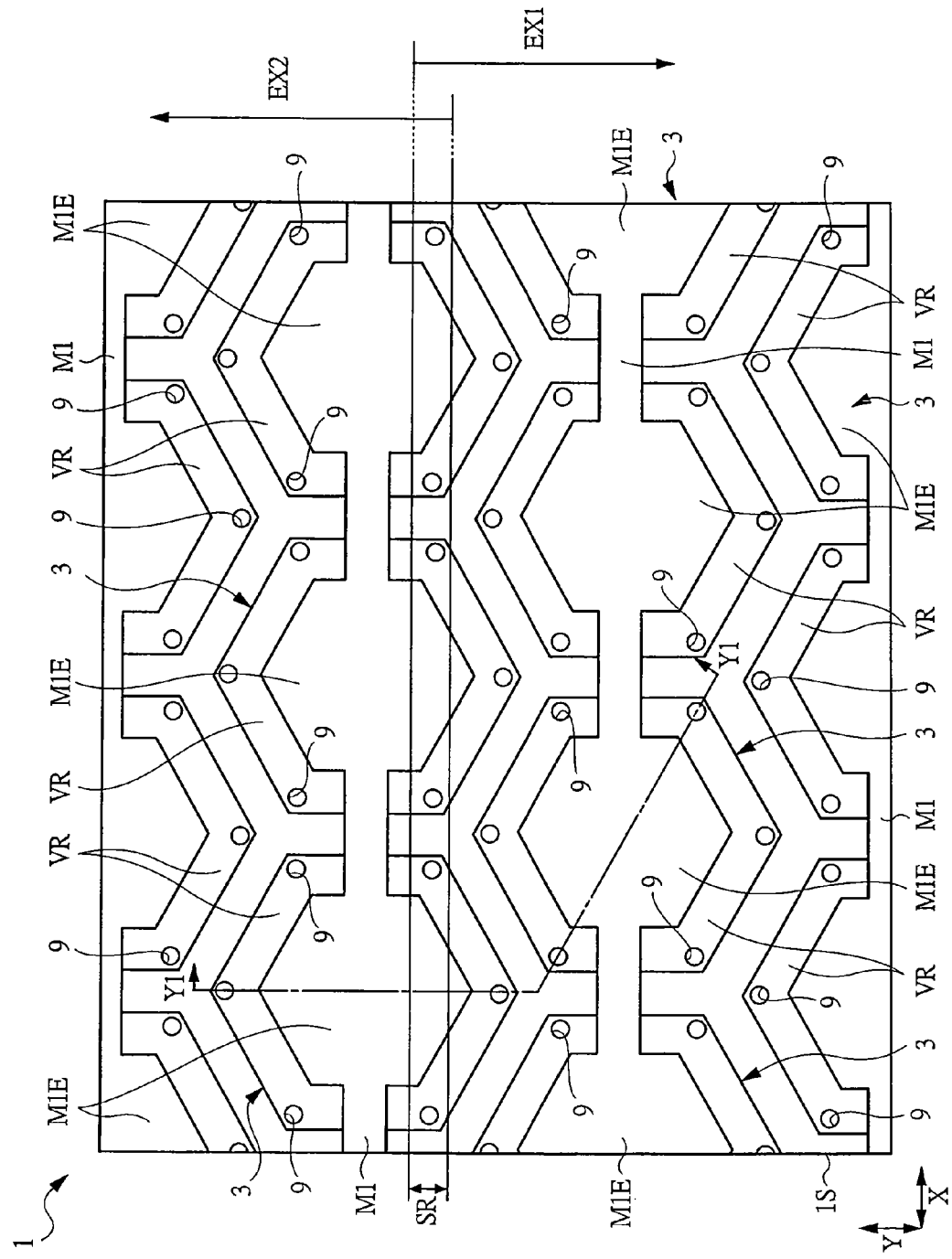
FIG. 16 is an enlarged plan view illustrating a principal part of an example of a stitching exposure area and its peripheral area of the semiconductor chip having sensor cells examined by the inventors.
Figure 17:
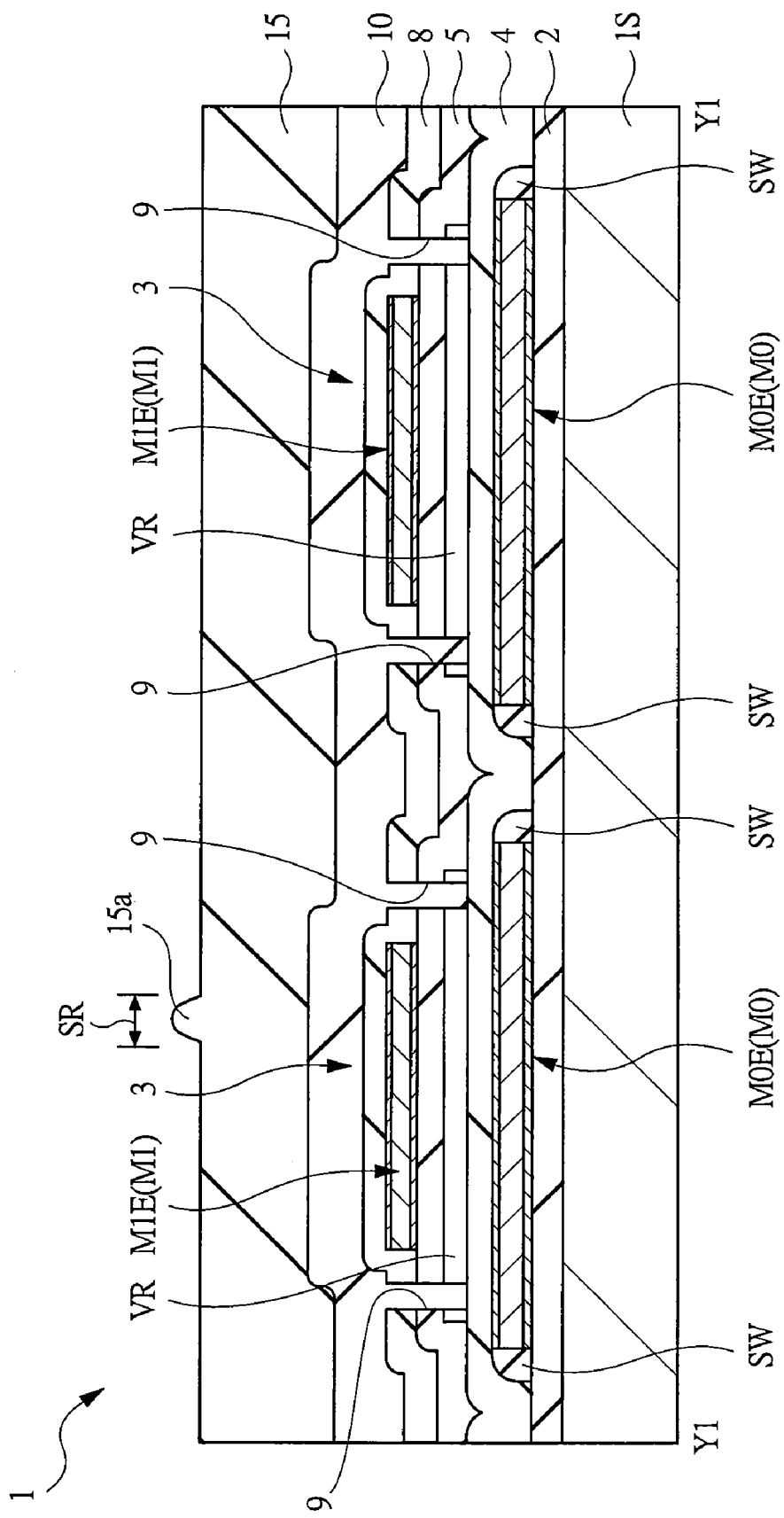
FIG. 17 is a sectional view taken along the line Y1-Y1 of FIG. 16.

FIG. 16 is an enlarged plan view illustrating the principal part of an example of the stitching exposure area SR and its peripheral area of the semiconductor chip 1 examined by the inventors of the present invention. FIG. 17 is a sectional view taken along the line Y1-Y1 of FIG. 16. In FIG. 16, in order to make the configuration in the drawing easy to understand, the illustration of the lower electrode wirings M0 and the lower electrodes M0E is omitted.

In the stitching exposure area SR, a part of the first-time exposure area EX1 is superposed on a part of the second-time exposure area EX2, and the double exposure is carried out. That is, the stitching exposure area SR is irradiated with more amount of exposing light than the other areas. For this reason, a protrusion 15a is formed on the stitching exposure area SR on the upper surface of the negative-type photosensitive insulating film 15 after development. The protrusion 15a protrudes partially from the upper surface of the negative-type photosensitive insulating film 15 so as to draw an arc, and it extends continuously along the short-side direction (first direction X) of the semiconductor chip 1. Accordingly, the stitching exposure areas SR of the developed negative-type photosensitive insulating film 15 have a larger thickness than the other areas. According to the examination by the inventors of the present invention, the thickness of the photosensitive insulating film 15 in the stitching exposure areas SR is, for example, about 4.4 μm, and it is larger by about 25% than the other areas. Further, a width (dimension in the short-side direction) of the protrusion 15a is, for example, about 3 to 4 μm.

Incidentally, in the example shown in FIG. 16, the stitching exposure areas SR are arranged so as to be largely superposed on the cavity portions VR of the oscillators 3 adjacent in the first direction X when viewed in a plan view (in this case, the stitching exposure areas SR are largely superposed not only on the cavity portions VR but also on the upper electrodes M1E when viewed in a plan view). That is, the protrusion 15a is largely superposed on the cavity portion VR of the oscillator 3 when view in a plan view (in this case, the protrusion 15a is largely superposed not only on the cavity portion VR but also on the upper electrode M1E when viewed in a plan view).

However, the inventors of the present invention have found out for the first time that the following problem arises in the case of the arrangement of the stitching exposure areas as described above. More specifically, when the protrusion 15a is formed at a position which is superposed on each of the cavity portions VR of the oscillators 3, the transmission attenuation amount of ultrasonic waves in the negative-type photosensitive insulating film 15 partly changes. As a result, the transmission/reception sensitivity of the ultrasonic waves fluctuates, and the image irregularity occurs. Therefore, the inventors of the present invention have found out for the first time that the thickness control of the photosensitive film 15 is necessary when the photosensitive insulating film 15 is provided on the upper layer of the semiconductor chip 1 in an ultrasonic sensor (sensor of electrostatic capacitance type).

Incidentally, even when a positive-type photosensitive insulating film is used instead of the negative-type photosensitive insulating film 15, the patterns of the openings 16a and 16b can be formed if a dark field pattern type reticle is used at the time of exposure. A relationship between the type of the reticle and the positive and negative-type photosensitive insulating films will be described below.

Figure 18:
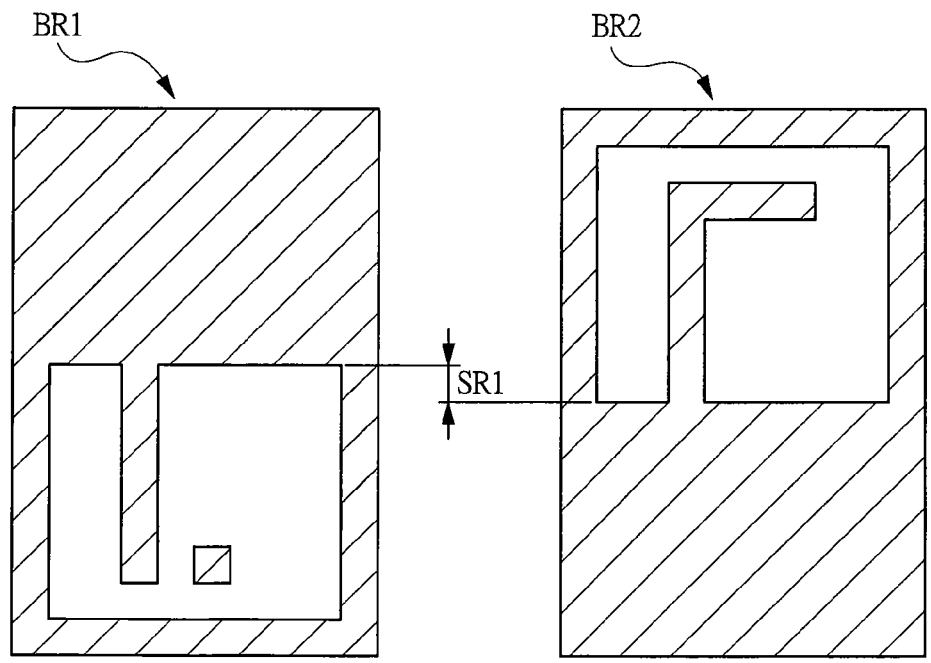
FIG. 18 is a plan view illustrating an example of a bright field pattern type reticle.
Figure 19:
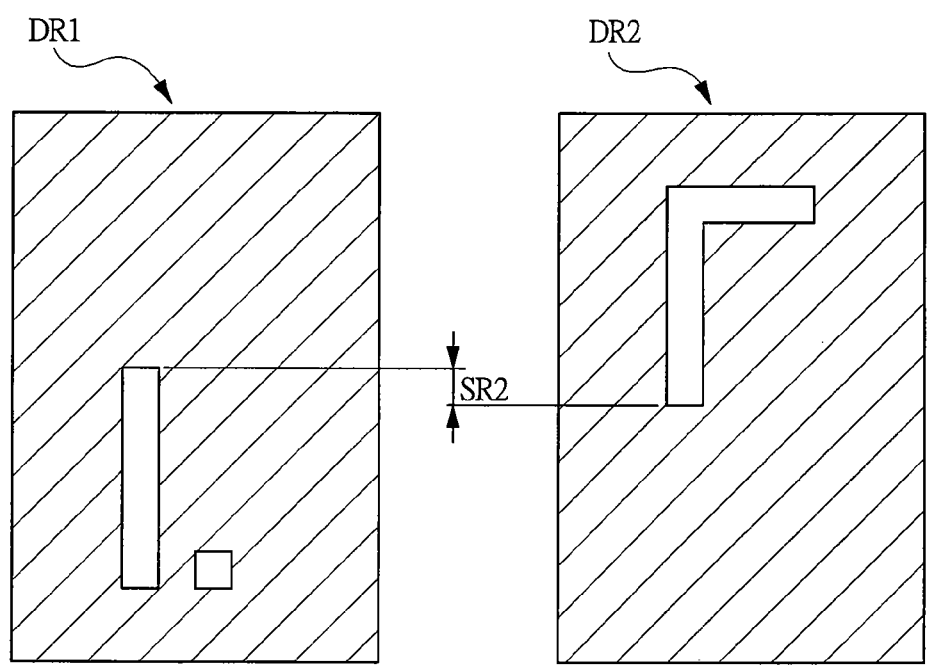
FIG. 19 is a plan view illustrating an example of a dark field pattern type reticle.

FIG. 18 and FIG. 19 are plan views illustrating examples of the bright field pattern type reticles BR1 and BR2 and the dark field pattern type reticles DR1 and DR2.

The reticles BR1 and BR2 in FIG. 18 and the reticles DR1 and DR2 in FIG. 19 form (transfer) the desired patterns having the same shape onto the photosensitive insulating films. In this case, in order to make the drawing easy to understand, light shielding areas where the exposing light is shielded are shown by hatching, and light transmitting areas through which the exposing light transmits are shown by outline. In the bright field pattern type, the area of the light transmitting areas is larger and the area of the light shielding areas is smaller than those of the dark field pattern type.

In FIG. 18, the two right and left reticles BR1 and BR2 are superposed on the same photosensitive insulating film, and the exposure is performed. In this manner, desired patterns are transferred to the photosensitive insulating film. The stitching exposure area SR1 is an area where the exposure areas of the two reticles BR1 and BR2 are superposed.

In FIG. 19, the two right and left reticles DR1 and DR2 are superposed on the same photosensitive insulating film, and the exposure is performed. In this manner, desired patterns are transferred to the photosensitive insulating film. The stitching exposure area SR2 is an area where the exposure areas of the two reticles DR1 and DR2 are superposed.

Figure 20A:
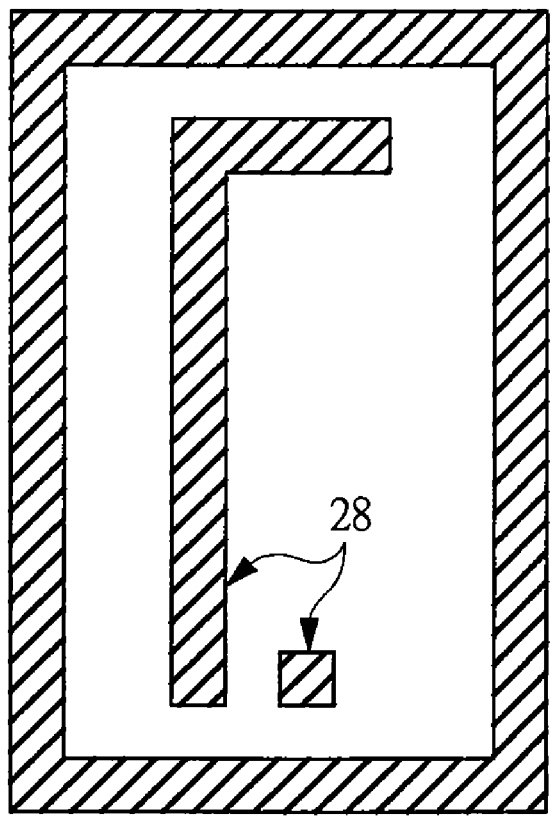
FIG. 20A is a plan view illustrating a positive-type photosensitive insulating film pattern formed by development in the case where a positive-type photosensitive insulating film is exposed by using the bright field pattern type reticle of FIG. 18.
Figure 20B:
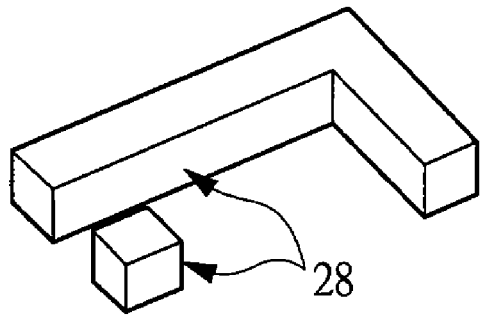
FIG. 20B is a perspective view illustrating the positive-type photosensitive insulating film pattern.

FIG. 20 illustrates a positive-type photosensitive insulating film pattern 28 formed by development when a positive-type photosensitive insulating film (photosensitive polyimide film) is subjected to the exposure process by using the bright field pattern type reticles BR1 and BR2 of FIG. 18. In FIG. 20, FIG. 20A is a plan view and FIG. 20B is a perspective view. In the case of the positive type, since the exposed portion is removed, the stitching exposure area SR1 where double exposure is carried out is also removed, and a protrusion does not remain after development.

Figure 21A:
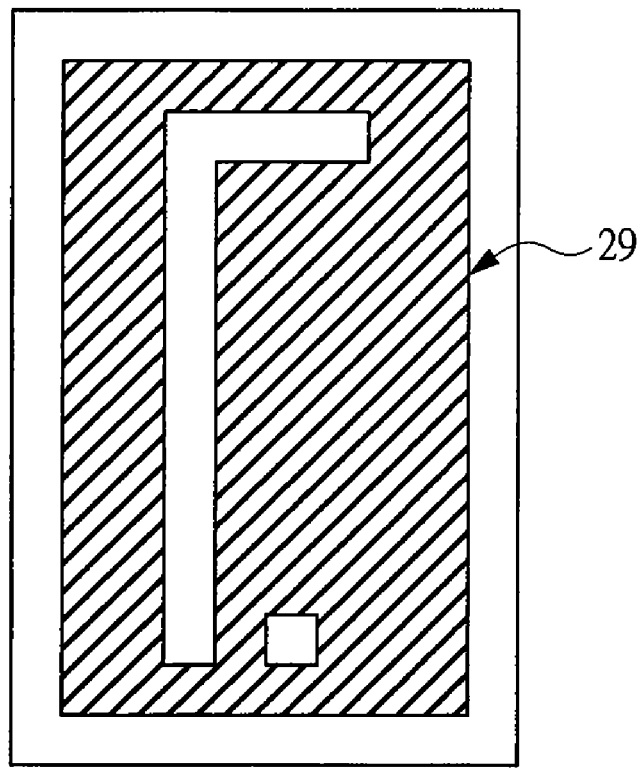
FIG. 21A is a plan view illustrating a negative-type photosensitive insulating film pattern formed by development in the case where a negative-type photosensitive insulating film is exposed by using the bright field pattern type reticle of FIG. 18.
Figure 21B:
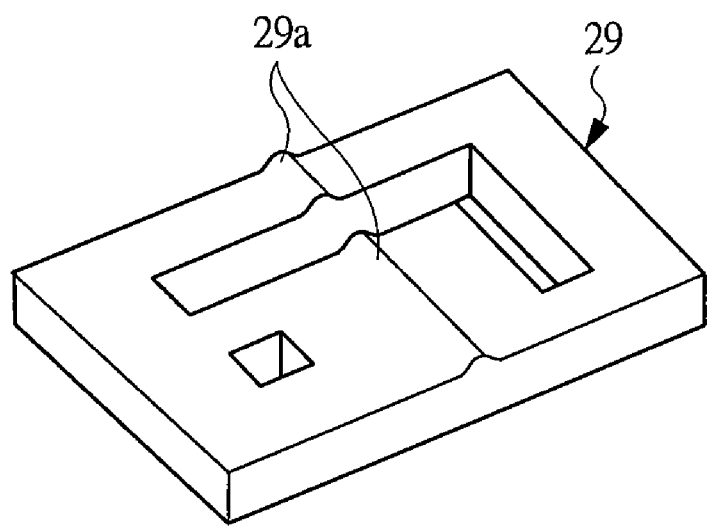
FIG. 21B is a perspective view illustrating the negative-type photosensitive insulating film pattern.

FIG. 21 illustrates a negative-type photosensitive insulating film pattern 29 formed by development when a negative-type photosensitive insulating film (photosensitive polyimide film) is subjected to the exposure process by using the bright field pattern type reticles BR1 and BR2 of FIG. 18. In FIG. 21, FIG. 21A is a plan view and FIG. 21B is a perspective view. In the case of the negative type, since the exposed portion remains, a protrusion 29a is formed in the stitching exposure area SR1 where double exposure is carried out after development.

Figure 22A:
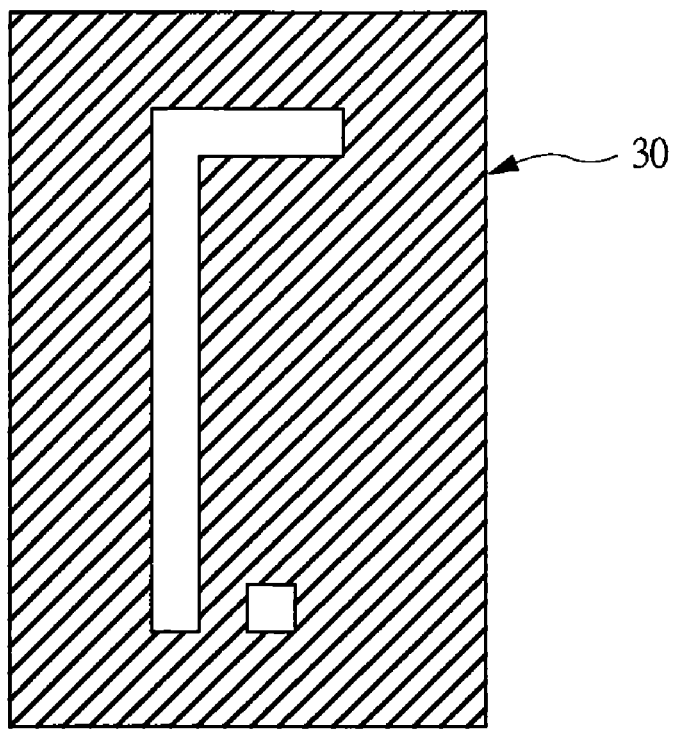
FIG. 22A is a plan view illustrating a positive-type photosensitive insulating film pattern formed by development in the case where a positive-type photosensitive insulating film is exposed by using the dark field pattern type reticle of FIG. 19.
Figure 22B:
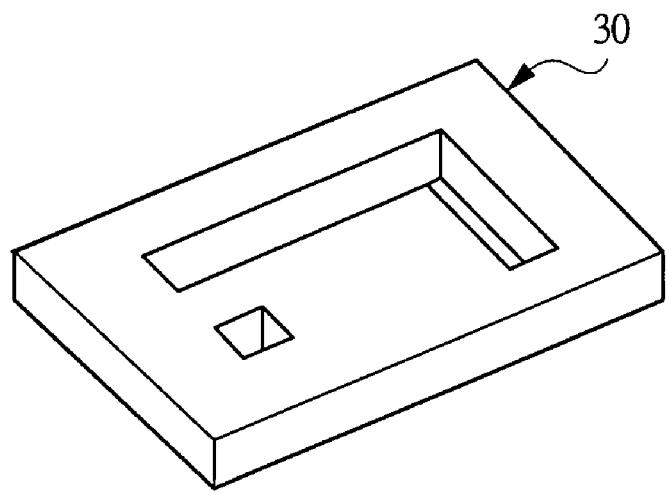
FIG. 22B is a perspective view illustrating the positive-type photosensitive insulating film pattern.

FIG. 22 illustrates a positive-type photosensitive insulating film pattern 30 formed by development when a positive-type photosensitive insulating film (photosensitive polyimide film) is subjected to the exposure process by using the dark field pattern type reticles DR1 and DR2 of FIG. 19. In FIG. 22, FIG. 22A is a plan view and FIG. 22B is a perspective view. In this case, the pattern similar to that of FIG. 21 is formed, but in the case of the positive type, since the exposed portion is removed, the stitching exposure area SR2 where double exposure is carried out is also removed. Thus, different from the case of the negative type in FIG. 21, a protrusion does not remain after development.

Figure 23A:
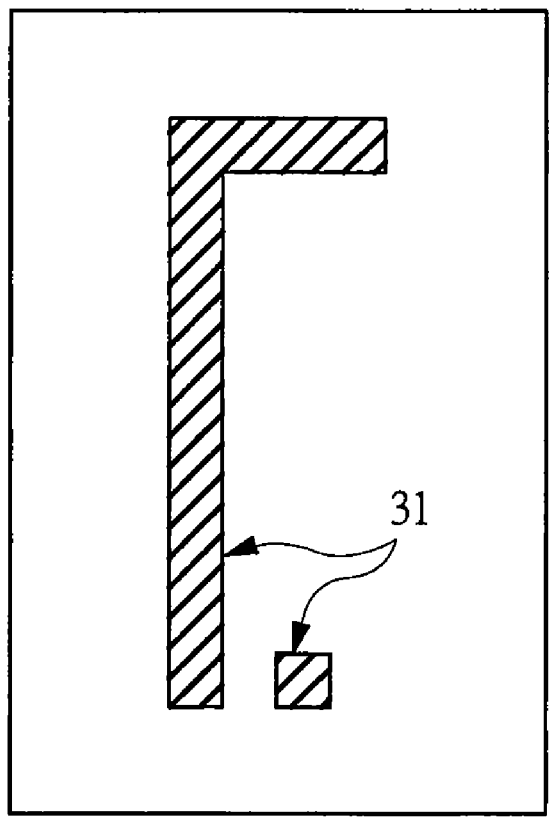
FIG. 23A is a plan view illustrating a negative-type photosensitive insulating film pattern formed by development in the case where a negative-type photosensitive insulating film is exposed by using the dark field pattern type reticle of FIG. 19.
Figure 23B:
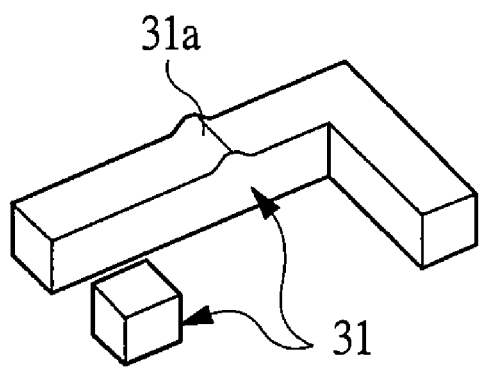
FIG. 23B is a perspective view illustrating the negative-type photosensitive insulating film pattern.

FIG. 23 illustrates a negative-type photosensitive insulating film pattern 31 formed by development when a negative-type photosensitive insulating film (photosensitive polyimide film) is subjected to the exposure process by using the dark field pattern type reticles DR1 and DR2 of FIG. 19. In FIG. 23, FIG. 23A is a plan view and FIG. 23B is a perspective view. In the case of the negative type, since the exposed portion remains, a protrusion 31a is formed in the stitching exposure area SR2 where double exposure is carried out after development.

As described above, in the case where the negative-type film is used, a protrusion is formed in a stitching exposure area regardless of the bright field pattern and the dark field pattern. Further, the patterns of the openings 16a and 16b are formed in the manner as shown in FIG. 21 and FIG. 22. More specifically, they correspond to the case where a negative-type photosensitive insulating film is exposed by using the bright field pattern type reticles or the case where a positive-type photosensitive film is exposed by using the dark field pattern type reticles.

Accordingly, in the case where an adverse effect of the stitching exposure areas is taken into consideration, it seems preferable that the positive-type photosensitive insulating film in which a protrusion is not formed in the stitching exposure area is used. In the case of the positive type, however, since all the development area in the thickness direction has to be exposed, the load at the time of exposure becomes large when the photosensitive insulating film 15 is increased in thickness.

On the contrary, in the case of the negative type, since it is sufficient if a surface portion to be left as a pattern is exposed so as to obtain the resistance to a developer, the exposure is not difficult even when the film thickness of the photosensitive insulating film 15 is increased. From the viewpoint as a protective film, therefore, it is preferable that the negative-type film whose thickness can be easily increased without putting a load on exposure is used as the photosensitive insulating film 15. However, the adverse effect of the stitching exposure areas has to be solved.

For its solution, in the first embodiment, in the case where the semiconductor device having a structure in which the plurality of oscillators 3 (cavity portions VR) are covered with the negative-type photosensitive insulating film 15 is manufactured, the stitching exposure area SR (protrusion 15a) is arranged so as to avoid the plurality of oscillators 3 (cavity portions VR).

Figure 24:
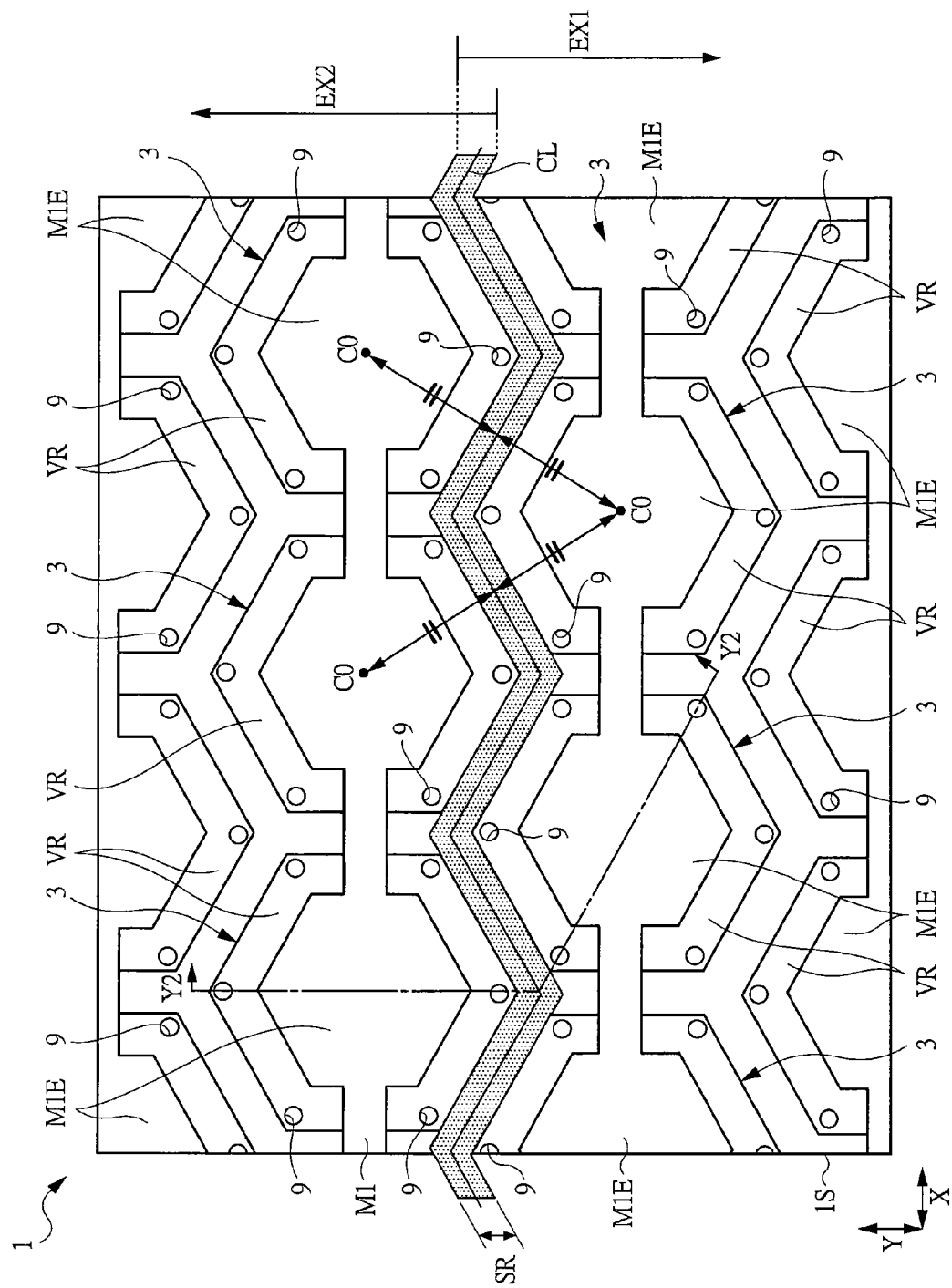
FIG. 24 is an enlarged plan view illustrating a principal part of an example of a stitching exposure area and its peripheral area on the semiconductor chip according to an embodiment of the present invention.
Figure 25:
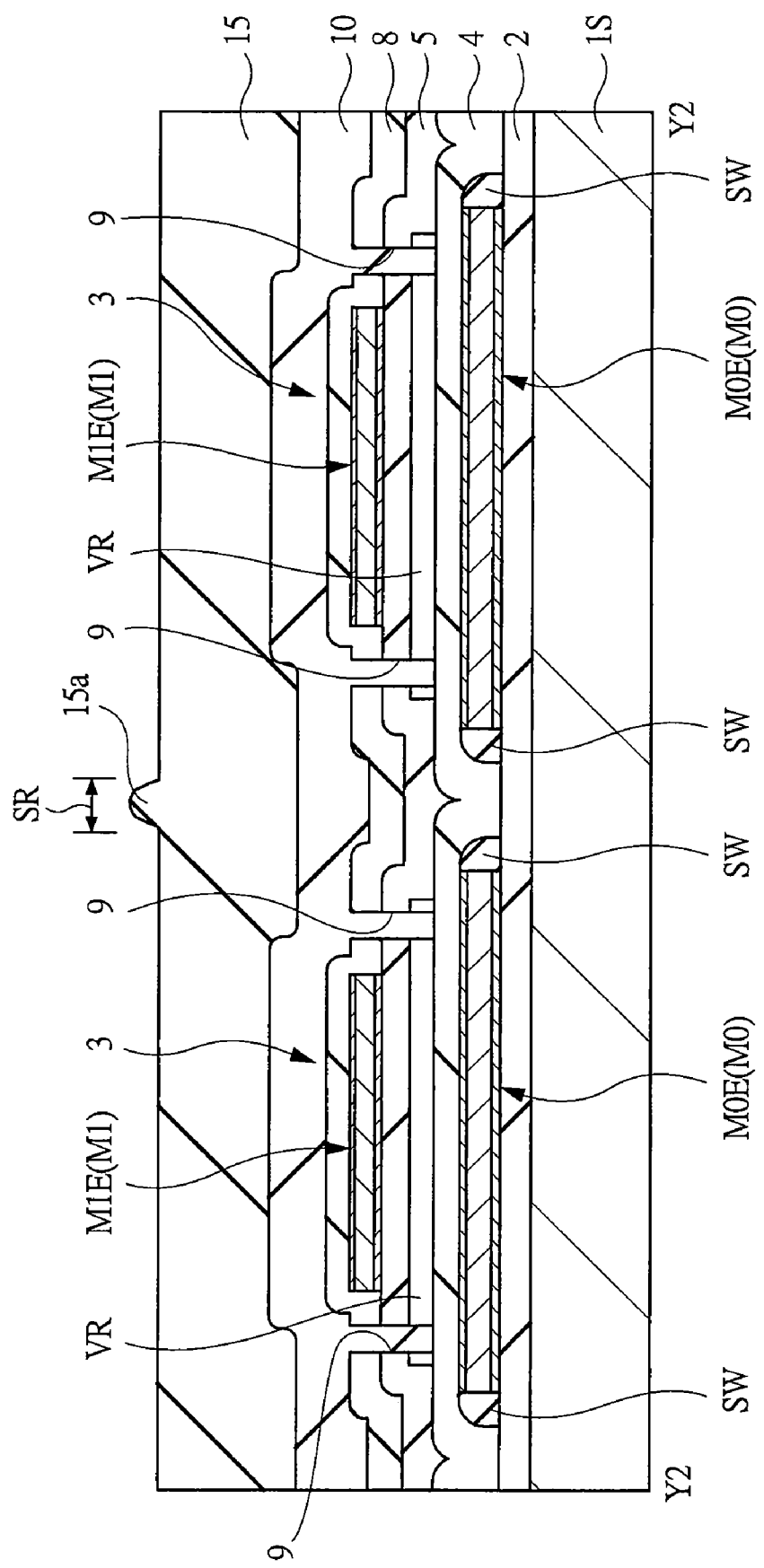
FIG. 25 is a sectional view taken along the line Y2-Y2 of FIG. 24.

FIG. 24 is an enlarged plan view illustrating the principal part of an example of the stitching exposure area SR and its peripheral areas on the semiconductor chip 1 according to the first embodiment. FIG. 25 is a sectional view taken along the line Y2-Y2 of FIG. 24. In order to make the configuration in FIG. 24 easy to understand, the illustration of the lower electrode wiring M0 and the lower electrode M0E is omitted. The stitching exposure area SR is shown by pearskin-like hatching.

In the first embodiment, the stitching exposure area SR (protrusion 15a) is arranged so that a center CL (apex of the protrusion 15a) of the width (dimension in the short-side direction) of the stitching exposure area SR does not pass on the cavity portions VR of the adjacent oscillators 3 positioned above and below (second direction Y) the stitching exposure area SR (protrusion 15a).

More specifically, the stitching exposure area SR (protrusion 15a) is arranged so that the center CL (apex of the protrusion 15a) of the width (dimension in the short-side direction) of the stitching exposure area SR passes through the gap between the adjacent oscillators 3 positioned above and below (second direction Y) the stitching exposure area SR.

Therefore, the stitching exposure area SR (protrusion 15a) is arranged so that the center CL (apex of the protrusion 15a) of the width (dimension in the short-side direction) of the stitching exposure area SR passes through the area of the pillar-shaped body 20. The pillar-shaped body 20 is jointed and fixed to the semiconductor substrate 1. Namely, the pillar-shaped body 20 does not contribute to the oscillation, and even when the protrusion 15a is formed on the pillar-shaped body 20, it does not cause the above-described problem that the transmission attenuation amount of the ultrasonic waves partly changes.

The width (dimension in the short-side direction) of the stitching exposure area SR is equal to or less than a dimension (width of the pillar-shaped body 20) between the adjacent oscillators 3 positioned above and below (second direction Y) the stitching exposure area SR. Further, the stitching exposure area SR (protrusion 15a) continuously extends along the short-side direction (first direction X) of the semiconductor chip 1, but its planar shape is not linear and has a saw-teeth shape along a part of an outer periphery of the oscillators 3 adjacent in the short-side direction (first direction X) of the semiconductor chip 1.

In an actual case, since the alignment of the masks (reticles) is displaced, even when the stitching exposure area (protrusion 15a) is designed to be disposed in the gap between the oscillators 3, a slight displacement inevitably occurs. For this reason, the stitching exposure area SR is completely disposed within the gap between the oscillators 3 in some cases, and a part of the stitching exposure area SR is slightly superposed on the oscillators 3 (cavity portions VR) in the other cases. In the first embodiment, the gap between the adjacent oscillators 3 is about 2 μm, and the width of the protrusion 15a is about 3 to 4 μm. Therefore, even when the apex of the protrusion 15a is positioned at the center of the gap between the adjacent oscillators 3, a bottom portion of the protrusion 15a (portion comparatively lower than the apex) is partially superposed on the oscillator 3 (cavity portion VR).

In order to arrange the stitching exposure areas (protrusions 15a) so as to avoid the oscillators 3 (cavity portions VR) although there are some errors due to the misalignment of the masks (reticles), the following manner is used. That is, the stitching exposure area SR is arranged so that the center CL (apex of the protrusion 15a) of the width (dimension in the short-side direction) of the stitching exposure area SR is positioned at the center of a line which connects the centers C0 of the adjacent oscillators 3 (oscillators 3 arranged to sandwich the stitching exposure area SR) positioned above and below (second direction Y) the stitching exposure area SR (protrusion 15a).

As described above, according to the first embodiment, the stitching exposure areas SR (protrusions 15a) are arranged on the pillar-shaped body 20 which is fixed to the semiconductor substrate 1 and does not contribute to the oscillation so as to avoid the oscillators 3 (cavity portions VR). By this means, the change in the transmission attenuation amount of the ultrasonic waves in the negative-type photosensitive insulating film 15 caused by the protrusion 15a can be suppressed or prevented. Therefore, the fluctuation of the transmission/reception sensitivity of the ultrasonic waves can be reduced or eliminated. Namely, the performance of the ultrasonic transmitting/receiving sensor can be improved. As a result, yield of the semiconductor device having the ultrasonic transmitting/receiving sensor can be improved.

Next, the case where the semiconductor device according to the first embodiment is applied to, for example, an ultrasonic echo diagnostic apparatus will be described below.

Figure 26:
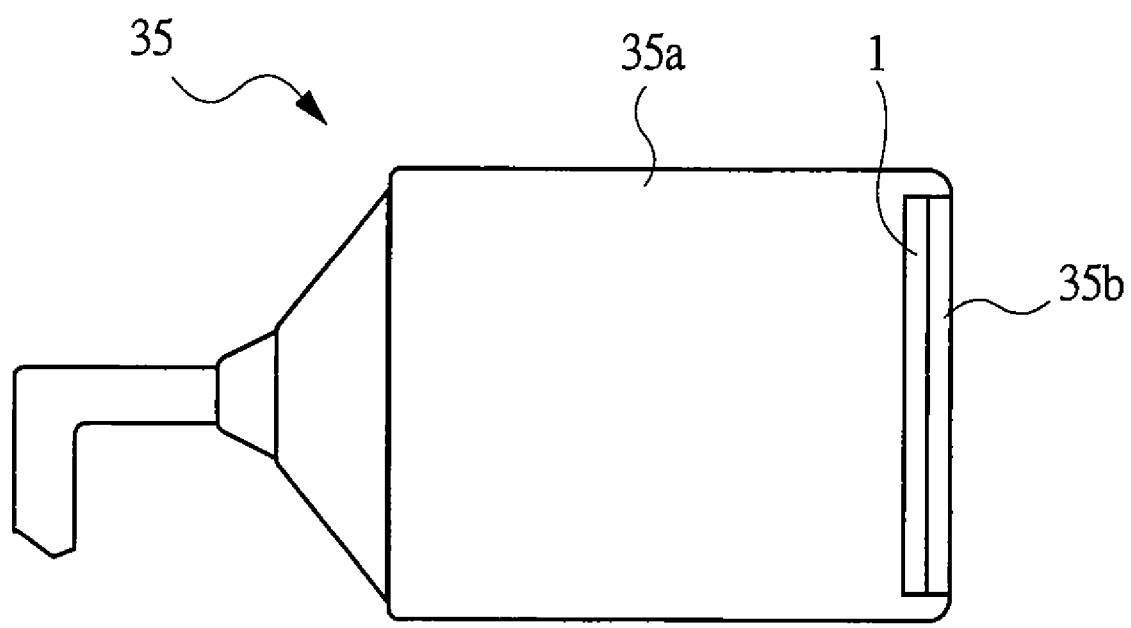
FIG. 26 is an explanatory diagram illustrating a probe of an ultrasonic echo diagnostic apparatus to which the semiconductor device according to an embodiment of the present invention is applied.

The ultrasonic echo diagnostic apparatus is a medical diagnostic apparatus which forms images of the inside of a biologic body which cannot be seen from the outside in real time by using ultrasonic waves above the audible spectrum and permeability of acoustic waves so as to enable visual inspection. A probe (search unit) of the ultrasonic echo diagnostic apparatus is shown in FIG. 26.

The probe 35 is an ultrasonic wave transmitting/receiving unit. The semiconductor chip 1 is attached to a front end surface of a probe case 35a constituting the probe 35, with the first main surface thereof (surface on which the plurality of oscillators 3 are formed) being directed to the outside. Further, an acoustic lens 35b is attached to the first main surface of the semiconductor chip 1. The acoustic lens 35b is curved along the short-side direction of the semiconductor chip 1.

In the ultrasonic diagnosis, after the front end (the side of the acoustic lens 35b) of the probe 35 is put to a body surface, the scanning is performed while gradually shifting the position of the probe 35. At this time, an ultrasonic pulse of several MHz is transmitted from the probe 35 put to the body surface to the inside of the biological body, and reflected waves (resonance or echo) from tissue boundaries whose acoustic impedances are different are received. By this means, cross-sectional images of the biomedical tissues are obtained, and thus, information about the object can be acquired. Distance information of a reflector can be obtained according to a time interval between the transmission and reception of the ultrasonic waves. Further, information about the presence or quality of the reflector can be acquired according to the level or outer shape of the reflected waves.

When the semiconductor chip 1 in the first embodiment is used for the probe 35 of the ultrasonic echo diagnostic apparatus, the sensor performance of the probe 35 can be improved. Accordingly, irregularity of diagnostic images can be reduced.

Second Embodiment

Figure 27:
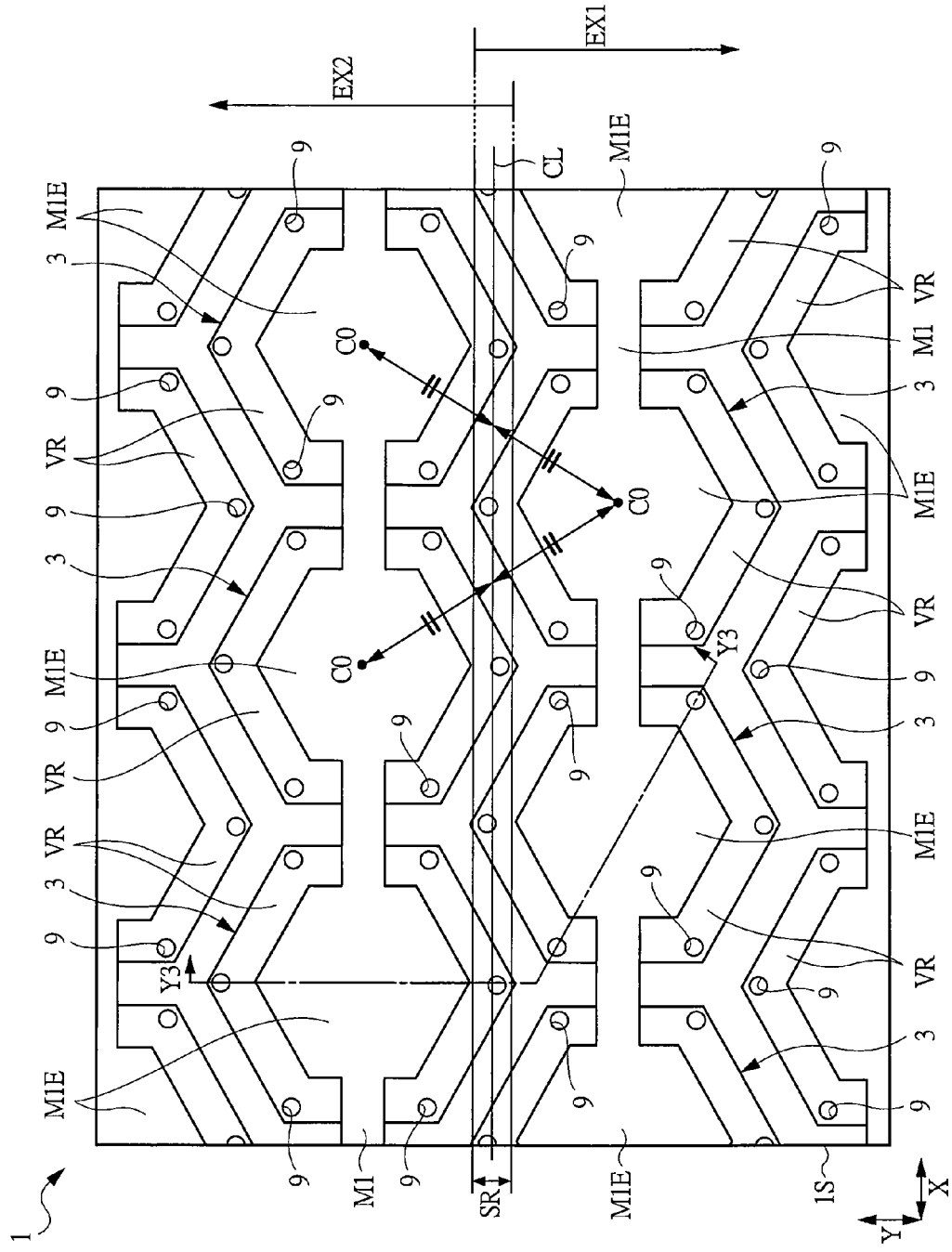
FIG. 27 is an enlarged plan view illustrating a principal part of an example of a stitching exposure area and its peripheral area of the semiconductor chip constituting the semiconductor device according to another embodiment of the present invention.
Figure 28:
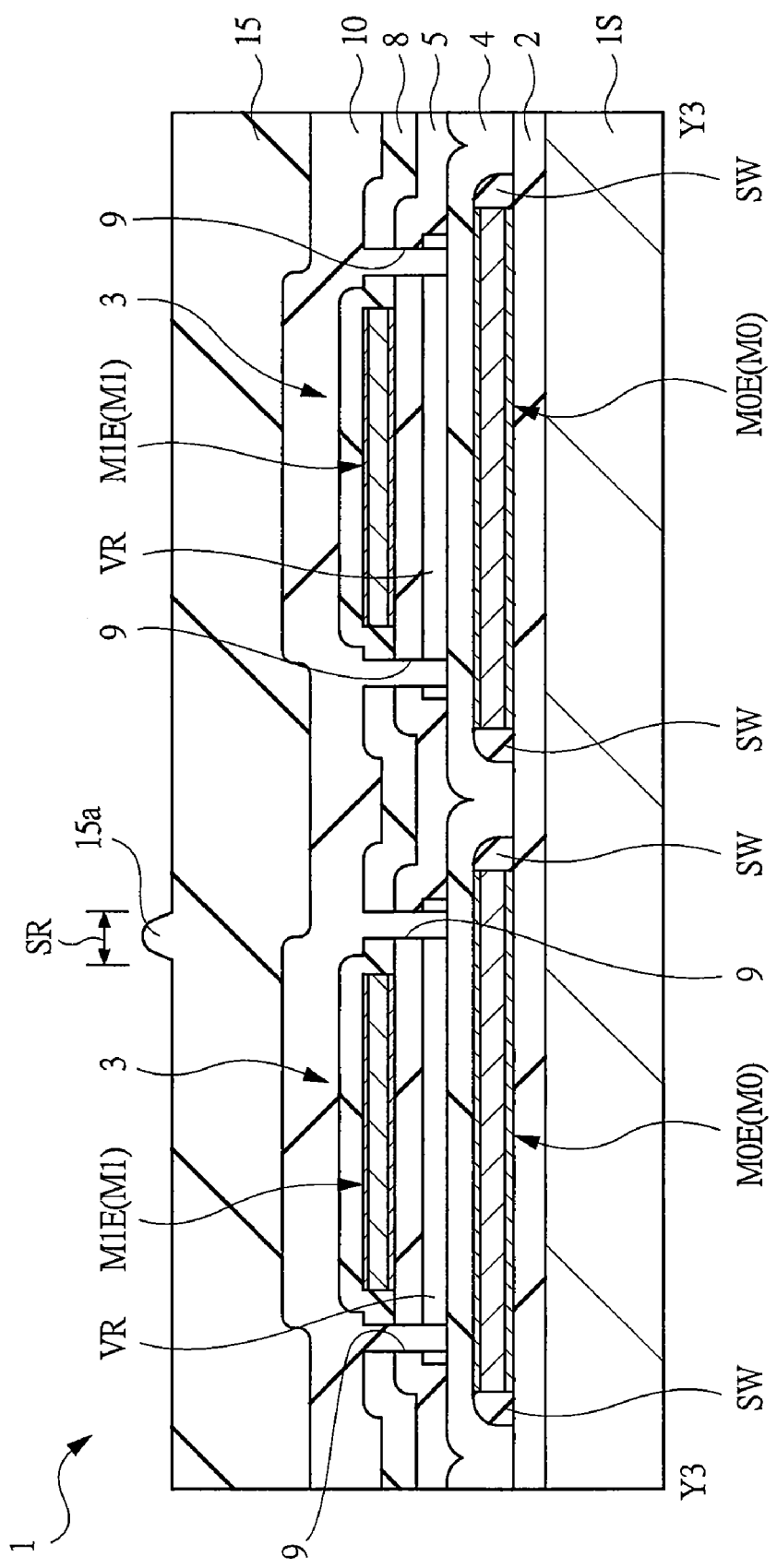
FIG. 28 is a sectional view taken along the line Y3-Y3 of FIG. 27.

FIG. 27 is an enlarged plan view illustrating the principal part of an example of the stitching exposure area SR and its peripheral areas of the semiconductor chip 1 according to a second embodiment. FIG. 28 is a sectional view taken along the line Y3-Y3 of FIG. 27. In FIG. 27, in order to make the configuration in the drawing easy to understand, the illustration of the lower electrode wirings M0 and the lower electrodes M0E is omitted.

Also in the second embodiment, the stitching exposure area SR (protrusion 15a) is arranged so as to avoid the oscillators 3 (cavity portions VR) as much as possible. More specifically, also in the second embodiment, the stitching exposure area SR is arranged so that the center CL (apex of the protrusion 15a) of the width (dimension in the short-side direction) of the stitching exposure area is positioned at the center of the line which connects the centers C0 of the adjacent oscillators 3 positioned above and below (second direction Y) the stitching exposure area SR.

In the second embodiment, however, the stitching exposure area SR (protrusion 15a) extends approximately linearly along the short-side direction (first direction X) of the semiconductor chip 1, and the center CL (apex of the protrusion 15a) of the width (dimension in the short-side direction) of the stitching exposure area SR is slightly superposed on the cavity portions VR of the adjacent oscillators 3 positioned above and below (second direction Y) the stitching exposure area SR.

The second embodiment illustrates the case where the stitching exposure area SR (protrusion 15a) is arranged between the upper electrodes M1E of the oscillators 3 positioned above and below (second direction Y) the stitching exposure area SR so as not to be superposed on the upper electrodes M1E when viewed in a plan view. Also in the second embodiment, the width (dimension in the short-side direction) of the stitching exposure area SR is equal to or less than the dimension (width of the pillar-shaped body 20) between the adjacent oscillators 3 above and below (second direction Y) the stitching exposure area SR.

Also, the stitching exposure area SR (protrusion 15a) is arranged so as to pass on the plurality of holes 9 arranged along the short-side direction (first direction X) of the semiconductor chip 1 or their vicinities. Although the holes 9 are arranged in areas where the cavity portions VR are formed, the insulating film 10 is embedded to be fixed into the holes 9. More specifically, the holes 9 do not contribute to the oscillation, and even when the protrusion 15a is formed on the holes 9 or their vicinities, it does not cause the above-described problem that the transmission attenuation amount of the ultrasonic waves partially change.

Therefore, by arranging the stitching exposure area SR (protrusion 15a) so as to pass on the plurality of holes 9 arranged along the short-side direction (first direction X) of the semiconductor chip 1, the change in the transmission attenuation amount of the ultrasonic waves in the negative-type photosensitive insulating film 15 due to the protrusion 15a can be suppressed. Accordingly, the fluctuation of the transmission/reception sensitivity of the ultrasonic waves can be reduced.

According to the second embodiment, although the stitching exposure area SR (protrusion 15a) is slightly superposed on the cavity portions VR of the oscillators 3 adjacent above and below (second direction Y) the stitching exposure area SR, the superposing amount can be reduced further than that in the structure shown in FIG. 16 and FIG. 17. Also, the stitching exposure area SR (protrusion 15a) is arranged so as to pass on the plurality of holes 9 which do not contribute to the oscillation. Accordingly, the change in the transmission attenuation amount of the ultrasonic waves in the negative-type photosensitive insulating film 15 due to the protrusion 15a can be further suppressed in comparison with the structure shown in FIG. 16 and FIG. 17. Therefore, the fluctuation of the transmission/reception sensitivity of the ultrasonic waves can be reduced. As a result, the performance of the ultrasonic transmitting/receiving sensor can be improved, and thus, the yield of the semiconductor device having the ultrasonic transmitting/receiving sensor can be improved.

In the foregoing, the invention made by the inventors of the present invention has been concretely described based on the embodiments. However, it is needless to say that the present invention is not limited to the foregoing embodiments and various modifications and alterations can be made within the scope of the present invention.

The first and second embodiments have described the case where the holes 9 are arranged for the oscillators 3. However, the arrangement is not limited to this. For example, the common hole 9 can be arranged for the plurality of oscillators 3. In other words, the common hole 9 to be a path for removing the sacrificial patterns 25 of the oscillators 3 can be arranged at a position of the pillar-shaped body where corner portions of the oscillators 3 face each other.

The first and second embodiments have illustrated a photosensitive polyimide film as an example of the negative-type photosensitive insulating film. However, the negative-type photosensitive insulating film is not limited to this. For example, a negative type inorganic photosensitive insulating film made of silicon oxide such as a negative-type photosensitive SOG (Spin On Glass) film may be used.

In the foregoing, the case where the present invention made by the inventors is applied to the method for manufacturing the semiconductor device having an ultrasonic sensor which is the background of the invention has been described. However, the application of the present invention is not limited to this, and it can be applied variously. For example, the present invention can be applied also to the method for manufacturing a semiconductor device having other sensors such as a pressure sensor and a microphone having cavity portions between the electrodes.

The present invention can be applied to the manufacturing industry of the semiconductor devices having sensors formed by using a MEMS technology.

What is claimed is:

1. A method for manufacturing a semiconductor device comprising:
   (a) a step of preparing a semiconductor substrate having a first main surface and a second main surface positioned on opposite sides in a thickness direction;
   (b) a step of forming a plurality of sensor cells in each of a plurality of chip areas on the first main surface of the semiconductor substrate;
   (c) a step of depositing a negative-type photosensitive insulating film on the first main surface of the semiconductor substrate so as to cover the plurality of sensor cells;
   (d) a step of performing an exposure process to the negative-type photosensitive insulating film in each of the plurality of chip areas, thereby transferring a desired pattern onto the negative-type photosensitive insulating film; and
   (e) a step of performing a development process to the negative-type photosensitive insulating film, thereby forming the desired pattern on the negative-type photosensitive insulating film,
   wherein each of the plurality of sensor cells includes:
   a first electrode formed on the first main surface of the semiconductor substrate;
   a second electrode provided so as to be opposed to the first electrode; and
   a cavity portion provided between the first electrode and the second electrode,
   wherein the step (d) includes a step of dividing one chip area into a plurality of exposure areas in each of the chip areas and performing the exposure of the divided exposure areas,
   wherein, in the step of exposing the plurality of exposure areas, the exposure process is performed so that a stitching exposure area where parts of adjacent exposure areas are superposed is formed in joint portions of the adjacent exposure areas of the plurality of exposure areas, whereby a protrusion is formed on an upper surface of the negative-type photosensitive insulating film, said protrusion being part of the negative-type photosensitive insulating film, and
   wherein the stitching exposure area is formed so that its center in a short-side direction is positioned at a center of a line which connects centers of the sensor cells adjacent with interposing the stitching exposure area therebetween.

2. The method for manufacturing a semiconductor device according to claim 1,
   wherein the step (b) includes:
   a step of forming a first wiring which forms the first electrode on the first main surface of the semiconductor substrate;
   a step of forming a first insulating film on the first main surface of the semiconductor substrate so as to cover the first wiring;
   a step of forming sacrificial patterns for forming the cavity portions on the first electrode of the first wiring via the first insulating film;
   a step of forming a second insulating film on the first main surface of the semiconductor substrate so as to cover the sacrificial patterns;
   a step of forming a second wiring which forms the second electrode on the second insulating film;
   a step of forming a third insulating film on the first main surface of the semiconductor substrate so as to cover the second wiring;
   a step of forming holes through which a part of the sacrificial patterns is exposed in a part of the second insulating film and the third insulating film;
   a step of selectively etching the sacrificial patterns through the holes, thereby forming the cavity portions between opposing surfaces of the first electrode and the second electrode;
   a step of depositing a fourth insulating film on the first main surface of the semiconductor substrate so as to cover the third insulating film; and
   a step of performing an etching process to the fourth insulating film, thereby forming first openings through which parts of the first wiring and the second wiring are exposed, and
   wherein the desired pattern in the step (e) is a pattern of second openings through which the parts of the first wiring and the second wiring in the first openings are exposed from the negative-type photosensitive insulating film.

3. The method for manufacturing a semiconductor device according to claim 1,
   wherein the stitching exposure area is arranged so that its center in the short-side direction passes through gaps between the adjacent sensor cells.

4. The method for manufacturing a semiconductor device according to claim 3,
   wherein a pillar-shaped body which is jointed to the semiconductor substrate is arranged between the adjacent sensor cells, and
   the stitching exposure area is arranged so that its center in the short-side direction passes through an area of the pillar-shaped body.

5. The method for manufacturing a semiconductor device according to claim 3,
   wherein a dimension of the stitching exposure area in the short-side direction is equal to or less than a dimension of a gap between the adjacent sensor cells.

6. The method for manufacturing a semiconductor device according to claim 1,
   wherein the stitching exposure area is arranged so that its center in the short-side direction does not pass on the cavity portions of the adjacent sensor cells.

7. The method for manufacturing a semiconductor device according to claim 1,
   wherein a planar shape of the plurality of sensor cells is hexagonal, and the plurality of sensor cells are arranged in a honeycomb shape.

8. The method for manufacturing a semiconductor device according to claim 1,
   wherein the plurality of sensor cells are oscillators constituting an ultrasonic sensor.

9. A semiconductor device, comprising:

a semiconductor chip having a first main surface and a second main surface positioned on opposite sides in a thickness direction;

a plurality of sensor cells formed on the first main surface of the semiconductor chip; and a negative-type photosensitive insulating film formed on the first main surface of the semiconductor chip so as to cover the plurality of sensor cells, wherein each of the plurality of sensor cells includes:

a first electrode formed on the first main surface of the semiconductor chip;

a second electrode provided so as to be opposed to the first electrode; and a cavity portion provided between the first electrode and the second electrode, wherein a protrusion is formed on an upper surface of the negative-type photosensitive insulating film, said protrusion being part of the negative-type photosensitive insulating film, and wherein the protrusion is formed so that its apex is positioned at a center of a line which connects centers of sensor cells adjacent with interposing the protrusion therebetween.

10. The semiconductor device according to claim 9,
wherein the protrusion is formed so that its apex is positioned between the adjacent sensor cells.

11. The semiconductor device according to claim 10,
wherein a pillar-shaped body which is jointed to the semiconductor chip is arranged between the plurality of adjacent sensor cells, and
the protrusion is formed so that its apex passes through an area of the pillar-shaped body.

12. The semiconductor device according to claim 9,
wherein the protrusion is formed so that its apex is not superposed on the cavity portions of the adjacent sensor cells.

13. The semiconductor device according to claim 9,
wherein the protrusion is formed so as to extend along a comparatively shorter side of the semiconductor chip.

14. The semiconductor device according to claim 9,
wherein a planar shape of the plurality of sensor cells is hexagonal, and the plurality of sensor cells are arranged in a honeycomb shape.

15. The semiconductor device according to claim 9,
wherein the plurality of sensor cells are oscillators constituting an ultrasonic sensor.

* * * * *